US012628389B2

(12) United States Patent
Sung et al.

(10) Patent No.: US 12,628,389 B2
(45) Date of Patent: May 12, 2026

(54) NANOSHEET FET WITH CONTROLLED OVERLAY MARK

(71) Applicant: INTERNATIONAL BUSINESS MACHINES CORPORATION, Armonk, NY (US)

(72) Inventors: Min Gyu Sung, Latham, NY (US); Susan Ng Emans, Albany, NY (US); Tao Li, Slingerlands, NY (US); Ruilong Xie, Niskayuna, NY (US); Anton Tokranov, Halfmoon, NY (US)

(73) Assignee: International Business Machines Corporation, Armonk, NY (US)

( * ) Notice: Subject to any disclaimer, the term of this patent is extended or adjusted under 35 U.S.C. 154(b) by 404 days.

(21) Appl. No.: 18/533,072

(22) Filed: Dec. 7, 2023

(65) Prior Publication Data

US 2025/0194180 A1     Jun. 12, 2025

(51) Int. Cl.
| | |
|---|---|
| *H10W 46/00* | (2026.01) |
| *H10D 30/01* | (2025.01) |
| *H10D 30/63* | (2025.01) |
| *H10D 62/10* | (2025.01) |
| *H10D 64/01* | (2025.01) |
| *H10D 84/83* | (2025.01) |

(52) U.S. Cl.
CPC ......... *H10D 62/118* (2025.01); *H10D 30/014* (2025.01); *H10D 30/63* (2025.01); *H10D 64/017* (2025.01); *H10D 64/021* (2025.01); *H10D 84/834* (2025.01); *H10W 46/00* (2026.01)

(58) Field of Classification Search
CPC .... H10D 62/118; H10D 30/014; H10D 30/63; H10D 84/834; H10D 64/017; H10D 64/021; H10D 64/256; H10D 30/0195; H10D 30/507; H10D 30/792; H10D 30/796; H10D 62/116; H10D 62/121; H10W 46/00; B82Y 10/00
USPC .......................................................... 257/288
See application file for complete search history.

(56) References Cited

U.S. PATENT DOCUMENTS

| | | | |
|---|---|---|---|
| 7,238,592 B2 | 7/2007 | Doumae | |
| 7,588,993 B2 | 9/2009 | Liu | |
| 8,822,343 B2 | 9/2014 | Hsieh | |
| 9,905,639 B2 | 2/2018 | Weber | |
| 10,236,258 B2 | 3/2019 | Moser | |
| 11,315,884 B2 | 4/2022 | Drowley | |
| 11,362,038 B2 | 6/2022 | Lin | |
| 2014/0065793 A1* | 3/2014 | Kang | H10P 50/71 |
| | | | 438/401 |
| 2022/0367294 A1 | 11/2022 | Nakamura | |
| 2023/0238448 A1 | 7/2023 | Chien | |
| 2023/0402406 A1* | 12/2023 | Huang | H10W 42/00 |
| 2025/0118679 A1* | 4/2025 | Peng | H10P 95/062 |

* cited by examiner

*Primary Examiner* — Monica D Harrison
(74) *Attorney, Agent, or Firm* — Samuel A. Waldbaum

(57)     ABSTRACT

A semiconductor device includes a nanosheet field effect transistor (FET), and an overlay mark adjacent to the nanosheet FET. The overlay mark includes a middle section, a first vertical spacer segment adjacent to a first end of the overlay mark, and a second vertical spacer segment adjacent to a second end of the overlay mark. The first vertical spacer segment and the second vertical spacer segment are isolated from direct contact with the middle section by a shallow trench isolation (STI).

20 Claims, 47 Drawing Sheets

OVERLAY MARK 812

NANOSHEET FET 810

ISOLATION LAYER 814

Y CUT

OVERLAY MARK 1312

NANOSHEET FET 1310

ADDITIONAL STI 1320

Y CUT

OVERLAY MARK 1812

NANOSHEET FET 1810

X CUT

2600

FORM THE NANOSHEET FET
2610

FORM THE OVERLAY MASK
2620

FORM THE MIDDLE SECTION
2630

FORM A FIRST VERTICAL SPACER SEGMENT
2640

FORM A SECOND VERTICAL SPACER SEGMENT
2650

ISOLATE THE SPACER SEGMENTS FROM CONTACT WITH THE MIDDLE SECTION
2660

NANOSHEET FET WITH CONTROLLED OVERLAY MARK

BACKGROUND

Technical Field

The present disclosure generally relates to transistors, and more particularly, to nanosheet transistors with controlled overlay mark and methods of creation thereof.

Description of the Related Art

Overlay marks and overlay metrology enable precise alignment and error correction between device layers during multi-step semiconductor manufacturing. These overlay marks can be used to match the electrical connections across integrated device structures.

SUMMARY

According to an embodiment, a semiconductor device includes a nanosheet field effect transistor (FET), and an overlay mark adjacent to the nanosheet FET. The overlay mark includes a middle section, a first vertical spacer segment adjacent to a first end of the overlay mark, and a second vertical spacer segment adjacent to a second end of the overlay mark. The first vertical spacer segment and the second vertical spacer segment are isolated form direct contact with the middle section by a shallow trench isolation (STI).

In on embodiment, the semiconductor device includes first alternating layers extended vertically on the first end of the middle section, and second alternating layers extended vertically on the second end of the middle section.

In one embodiment, the first alternating layers include silicon and the first vertical spacer segment, and the second alternating layers include silicon and the second vertical spacer segment.

In one embodiment, the middle section further includes a substrate horizontally extended from the first end to the second end, and a source/drain region horizontally extended over the substrate. Portions of the source/drain region on the first end and the second end are extended vertically and are in contact with the first alternating layers and the second alternating layers.

In one embodiment, the first alternating layers are isolated from the first spacer segment via the STI, and the second alternating layers are isolated from the second spacer segment via the STI.

In one embodiment, the source/drain region comprises silicon or silicon germanium.

In one embodiment, the nanosheet FET includes nanosheets of silicon layers and silicon germanium layers.

According to an embodiment, a semiconductor device includes a nanosheet field effect transistor (FET) and an overlay mark adjacent to the nanosheet FET. The overlay mark includes a middle section, a first spacer segment vertically extended over sidewalls of the middle section on a first end, and a second spacer segment vertically extended over sidewalls of the middle section on a second end.

In one embodiment, the middle section further includes a substrate horizontally extended from the first end to the second end, and a source/drain region horizontally extended over the substrate.

In one embodiment, the source/drain region includes silicon or silicon germanium.

In one embodiment, the nanosheet FET includes nanosheets of silicon layers and silicon germanium layers.

According to an embodiment, a method of fabricating a semiconductor device includes forming a nanosheet field effect transistor (FET) and forming an overlay mark adjacent to the nanosheet FET. Forming the overlay mark includes forming a middle section, forming a first vertical spacer segment adjacent to a first end of the overlay mark, and forming a second vertical spacer segment adjacent to a second end of the overlay mark, and isolating the first spacer segment and the second spacer segment from the middle section by a shallow trench isolation (STI).

In one embodiment, forming the overlay mark further includes forming a substrate extended between the first end and the second end, and forming a source/drain region over the substrate.

In one embodiment, the method includes forming the STI over sidewalls of the middle section on the first end and the second end, removing an isolation layer from a top surface of the substrate, and forming a spacer layer over the top surface of the substrate.

In one embodiment, the method includes forming first alternating layers over the sidewalls of the middle section on the first end, and forming second alternating layers over the sidewalls of the middle section on the second end.

In one embodiment, the first alternating layers include silicon and the first spacer segment, and the second alternating layers include silicon and the second spacer segment.

In one embodiment, forming the source/drain region further includes extending the source/drain region vertically over the sidewalls of the first end and the sidewalls of the second end.

In one embodiment, the method includes isolating the first alternating layers from the first spacer segment via the STI. The second alternating layers are isolated from the second spacer segment via the STI.

In one embodiment, the source/drain region includes silicon or silicon germanium.

In one embodiment, forming the nanosheet FET further includes forming nanosheets of silicon layers and silicon germanium layers.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1A:
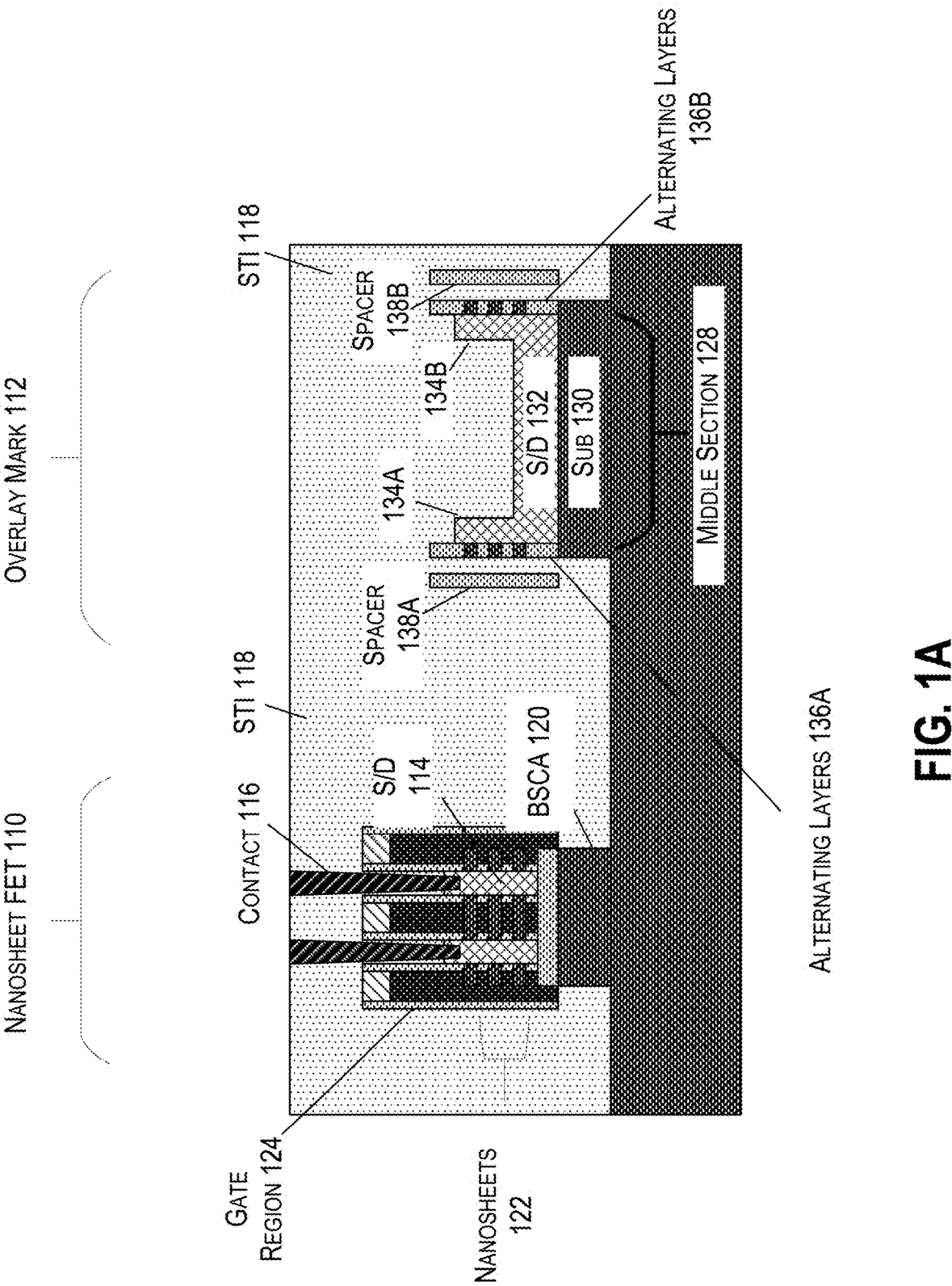
FIGS. 1A-1B illustrate a semiconductor device, in accordance with some embodiments.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a chip.

As used herein, the term "vertical" describes an orientation that is arranged perpendicular to the first surface of a chip, chip carrier, or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described herein-after may be combined with elements of different embodiments.

As used herein, certain terms are used indicating what may be considered an idealized behavior, such as, for example, "lossless," "superconductor," or "superconducting," which are intended to cover functionality that may not be exactly ideal but is within acceptable margins for a given application. For example, a certain level of loss or tolerance may be acceptable such that the resulting materials and structures may still be referred to by these "idealized" terms.

The concepts herein relate to nanosheet transistors, which are fundamental electronic devices that have revolutionized the field of electronics, and gate isolation layers. Nanosheet transistors serve as building blocks for numerous electronic circuits and are widely used in various applications. Overlay marks are specially designed test structures that are typically placed in the scribe lines between die on a wafer. The overlay marks include various geometric shapes such as squares, rectangles or frames imprinted in successive device layers during lithography. Commonly used overlay marks include box-in-box and frame-in-frame designs.

In the fabrication process flow, an interlayer dielectric isolation region is first formed to prevent electrical contact between conductive regions. This dielectric layer covers large areas across the wafer surface. Later, an etching process is used to selectively remove areas of this isolation dielectric in regions where connections are desired in subsequent layers. However, the etching does not completely remove the dielectric material, nor is the removal symmetric. This occurs prominently across wide overlay alignment mark areas which have large, patterned spaces. As a result, remnants of the dielectric layer cause a topological "step" height on the wafer surface in the overlay measurement patterns. In subsequent lithography processes, this underlying step causes an optical distortion during overlay metrology, and prevents the tool from correctly detecting the degree of overlay alignment to previous layers underneath the step. Such an inability to accurately measure overlay displacement can lead to misalignments being propagated as errors into additional device layers stacked on top. The devices then can fail due to the cumulative overlay issue introduced by the incomplete dielectric removal. To address this, the isolation dielectric etching process involves additional over-etch time tuned to completely clear the thicker isolation regions. This can eliminate underlying topological steps across wide overlay mark spaces and enable correct optical overlay measurements again.

To address the above-mentioned and other issues, disclosed is a semiconductor device with improved recess oxide (RX) layer recession process that yields uniform oxide removal across overlay measurement mark areas. The disclosed semiconductor device can standardize pattern heights for accurate metrology readings, enabling proper transistor junction (TJ) and resistor gate (RG) correction. To that end, during the fin removal of the disclosed semiconductor, the overlay mark is controlled by being encapsulated by a dielectric layer.

Accordingly, the teachings herein provide methods and systems of semiconductor device formation with controlled overlay mark. The techniques described herein may be implemented in a number of ways. Example implementations are provided below with reference to the following figures.

Example Semiconductor Device With Controlled
Overlay Mark Structure

Figure 1B:
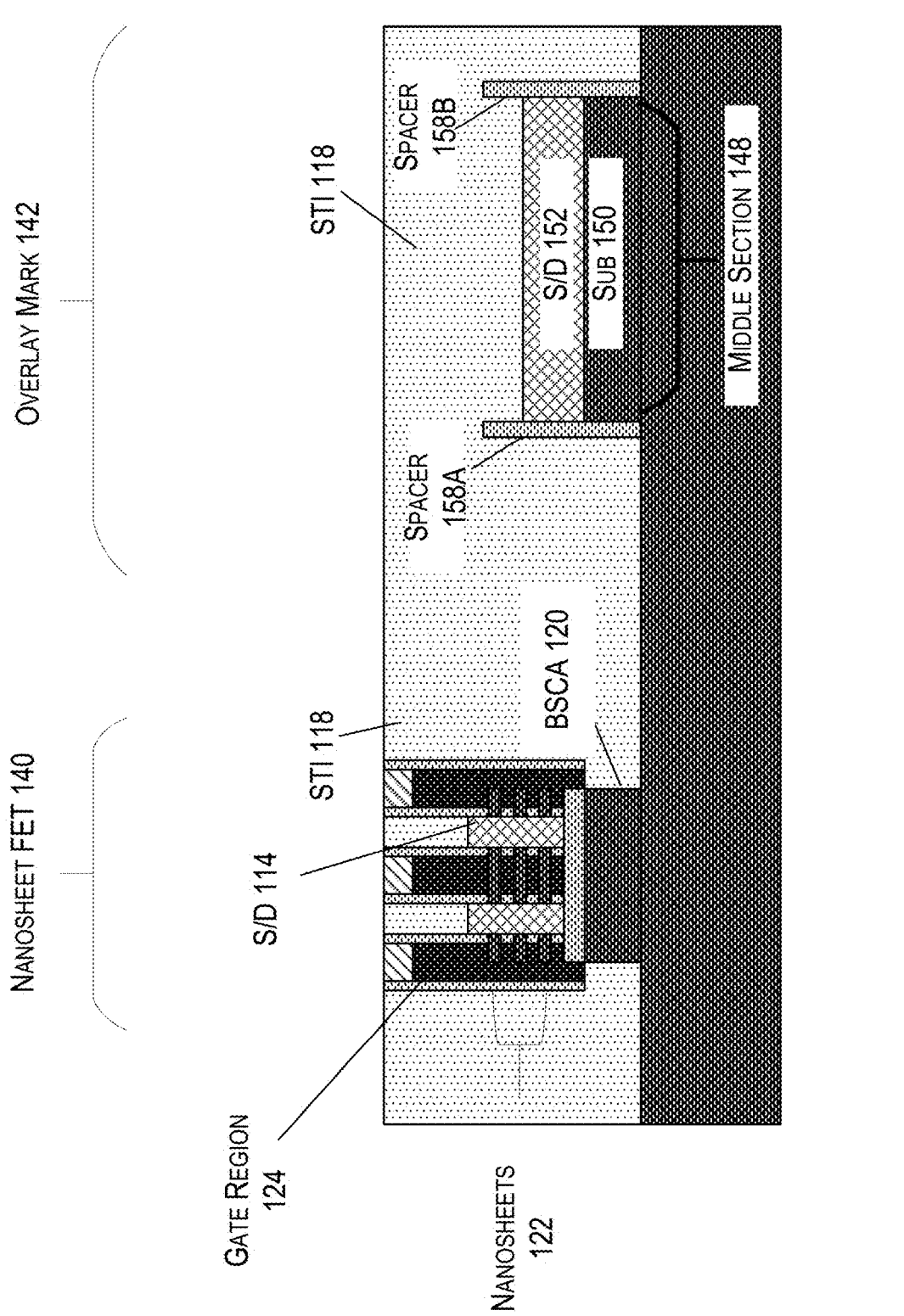
Figure 1C:
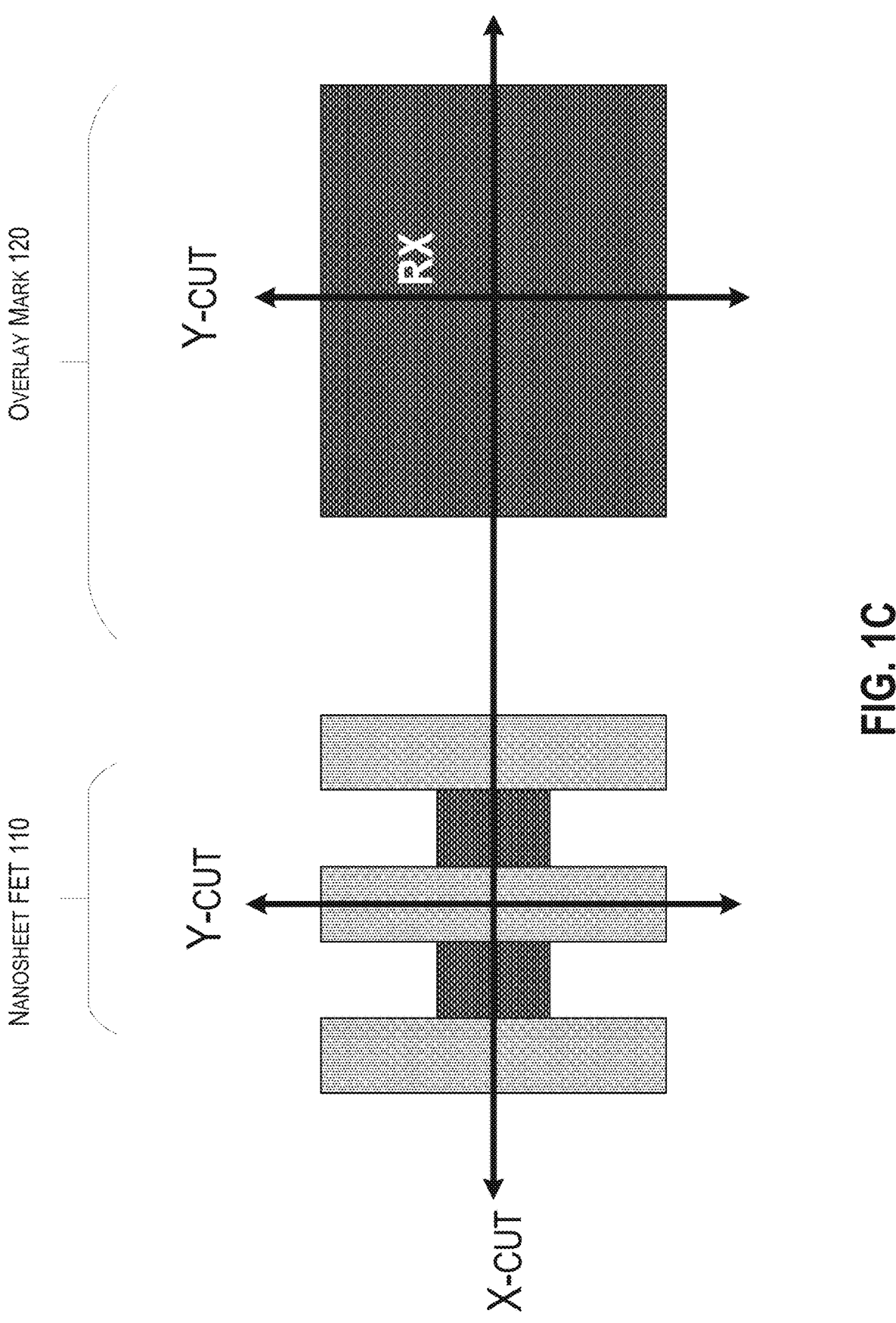
FIG. 1C illustrates a top view of a semiconductor device, in accordance with some embodiments.

Reference now is made to FIGS. 1A-1B, which are simplified cross-section views of semiconductor devices, consistent with illustrative embodiments. FIG. 1C depicts a top view of a semiconductor device. For example, FIG. 7A, and other figures denoted by A, illustrate a Y section of the semiconductor device, and FIG. 7B and other figures denoted by B illustrate a X section of the semiconductor device. Referring to FIG. 1A, the semiconductor device can include a nanosheet FET 110, and an overlay mark 112. The nanosheet FET 110 can include one or more source/drain regions 114, one or more contacts 116, a shallow trench isolation (STI) 118, a backside contact area (BSCA) 120, a plurality of nanosheets 122, and one or more gate regions 124.

Generally, the one or more source/drain regions 114 are salient components that play relevant roles in the semiconductor device's operation. Typically, source/drain regions are regions within the semiconductor material, e.g., the semiconductor device, where the current flows in and out of the transistor. The source region is the region through which the majority of charge carriers (e.g., electrons or holes) enter the channel of the semiconductor device and is responsible for providing the current that flows through the semiconductor device. The source region is typically doped to have an excess of charge carriers, creating a region with high carrier concentration. This abundance of carriers allows for the efficient injection of electrons or holes into the channel when a voltage is applied.

The drain region, on the other hand, is the region where the majority of charge carriers exit the channel. The drain region receives the current from the channel and carries the charge away from the transistor. Similar to the source, the drain region is also doped to have a high carrier concentration. The doping profile in the drain region ensures that carriers can easily flow out of the channel and into the drain region.

Each of the one more contact 116 establishes a connection between a source/drain region and other semiconductor devices. In some embodiments, one or more of the contacts ensure efficient electrical routing and connectivity within the semiconductor device. The fabrication of a contact can involve lithography and etching processes to define the contact area. The contacts can be made using conductive materials, such as copper (Cu) or tungsten (W).

The STI 118 includes shallow trenches in the semiconductor device filled with insulating materials to form isolation structures. The STI 118 can provide electrical isolation between adjacent transistors or components within the semiconductor device. The STI 118 can prevent electrical interference, leakage, and crosstalk, ensuring that the semiconductor device operates independently and reliably. In an embodiment, STI 118 can help reduce parasitic capacitance between adjacent transistors. The STI 118 also can prevent latch-up, a condition where a parasitic thyristor-like structure causes unintended device behavior. The STI 118 can further interrupt the formation of the parasitic p-n-p-n structure, enhancing device reliability.

The BSCA 120 is a region on the backside of the semiconductor device where electrical connections are made. By establishing the electrical contacts, the BSCA 120 ensures the proper functioning of the semiconductor device and facilitates electrical signal transmission. The BSCA 120 can serve as a thermal interface between the semiconductor device and a heat sink or other cooling mechanisms. By establishing direct contact with the substrate, the BSCA 120 can conduct the heat away from the semiconductor device, and contribute to improved thermal dissipation. In some embodiments, the BSCA 120 can help mitigate parasitic effects, such as substrate coupling or substrate noise, from the semiconductor device. In further embodiments, the BSCA 120 can allow for increased integration density in the semiconductor device. In an embodiment, the BSCA 120 can provide electrostatic discharge (ESD) protection to the semiconductor device. ESD events can cause significant damage to sensitive electronic components and thus should be avoided.

The plurality of nanosheets 122 can include three-dimensional structures in the gate metal, which are extended from the source region towards the drain region. Each nanosheet can include one or more layers. In some embodiments, the plurality of nanosheets 122 is made of alternating layers of silicon and silicon germanium.

In various embodiments, the one or more gate regions 124 serves as control elements that regulate the flow of current through the semiconductor device. The one or more gate regions 124 can be composed of a conductive material. The one or more gate regions 124 can control the flow of electric current between the source and drain regions. In some embodiments, by applying a voltage to the gate, the channel region's conductivity is modulated, allowing the semiconductor device to either allow or block the flow of current, which in turn enables the semiconductor device to act as electronic switches or amplifiers. The gate voltage can determine whether the semiconductor device is in an "on" or "off" state. When the gate voltage is below a certain threshold, the semiconductor device is in the "off" state, and the current flow between the source and drain is effectively blocked. On the other hand, when the gate voltage exceeds the threshold, the semiconductor device enters the "on" state, allowing current to flow through the channel region. In addition to acting as a switch, modulating the gate voltage can enable the one or more gate regions 124 to control the current flowing through the channel region, resulting in amplified output signals.

In an embodiment, the one or more gate regions 124 can enable the implementation of Boolean logic operations, such as AND, OR, and NOT, by controlling the flow of current based on the input voltages. Multiple semiconductor devices can be interconnected to form complex logic circuits, enabling the execution of various computational tasks in digital systems. In some embodiments, the one or more gate regions 124, along with other semiconductor device components, can facilitate the miniaturization and integration of electronic circuits. The ability to control the channel region's conductivity through the gate voltage allows for compact and highly efficient circuit designs.

Typically, in the junction module lithography process, there are significant overlay residuals, i.e., errors, occurring between the transistor junction (TJ) layer and resistor gate (RG) layer alignment to the previous recess oxide (RX) layer. The root cause is that the overlay measurement boxes or frames in the RX layer have asymmetrical height profiles. The asymmetrical height profile prevents the overlay metrology tool from correctly reading the degree of alignment between the successive TJ and RG layers relative to RX. Specifically, recession of the oxide in the RX layer overlay patterns is not uniform, resulting in some areas being recessed more deeply than others. This discrepancy creates height differences of several nanometers across the patterned boxes. The variable RX heights interfere with the diffraction signals used by the overlay metrology tool, which assumes a flat surface. The distorted diffraction causes inaccurate calculations of the overlay displacement errors between TJ/RG and RX by up to 8-10 nm. Such displacement errors, in turn, prevent precise correction of the TJ and RG layer alignments to match RX. The subsequent alignments rely on the malformed RX overlay patterns as reference, propagating the errors. However, the disclosed semiconductor device includes an overlay mark 112 with a uniform RX layer. The overlay mark 112 can include a middle section 128 encapsulated by the STI 118. The middle section 128 can include a substrate 130 extended horizontally from a first end to a second end. A source/drain region 132 is formed over the substrate 130. Further, a first vertical spacer segment 138A is located adjacent to the first end of the middle section 128 and second vertical spacer segment 138B is located adjacent to the second end of the middle section 128.

Portions of the source/drain region 134A and 134B, which are located at the first end and the second end of the middle section 128, are extended vertically and parallel to the first vertical spacer segment 138A and the second vertical spacer segment 138B, respectively. The portions of the source/drain region 134A and 134B are in contact with two alternating layers: the first alternating layers 136A and second alternating layers 136B. The first alternating layers 136A, which are extended vertically on the first end of the middle section 128, can be alternating layers made of silicon and a second material. The second material can be the same as the first vertical spacer segment 138A. Similarly, the second alternating layers 136B, which are extended vertically on the second end of the middle section 128, can be alternating layers made of silicon and a third material. The third material can be the same as the second vertical spacer segment 138B.

In various embodiments, the first vertical spacer segment 138A and the second vertical spacer segment 138B are isolated from direct contact with the middle section 128 by the STI 118. Further, the first alternating layers 136A are isolated from the first vertical spacer segment 138A via the STI 118. Similarly, the second alternating layers 136B are isolated from the second vertical spacer segment 138B via the STI 118. In some embodiments, the source/drain region 132 is made of silicon or silicon germanium.

Referring now to FIG. 1B, the semiconductor device can include a nanosheet FET 140, and an overlay mark 142. The nanosheet FET 140 can be similar to the nanosheet FET 140 shown in FIG. 1A. The overlay mark 142 can include a middle section 148 encapsulated by the STI 118. The middle section 148 can include a substrate 150 extended horizontally from a first end to a second end. A source/drain region 152 is formed over the substrate 150. Further, a first vertical spacer segment 158A is vertically extended over the sidewalls of the middle section 148 on a first end, and the second vertical spacer segment 158B is vertically extended over the sidewalls of the middle section 148 on the second end.

In various embodiments, the first vertical spacer segment 158A and the second vertical spacer segment 158B are isolated from direct contact with the middle section 148 by the STI 118. In some embodiments, the source/drain region 152 is made of silicon or silicon germanium.

Example Processes for Semiconductor Device With Controlled Overlay Mark Structures With the foregoing description of an example semiconductor device, it may be helpful to discuss an example process of manufacturing the same. To that end, FIGS. 2-16 illustrate various steps in the manufacture of a semiconductor device, consistent with illustrative embodiments. As noted above, figures denoted by A illustrate a Y section of the semiconductor device, and figures denoted by B illustrate an X section of the semiconductor device. It is also worth mentioning that the semiconductor depicted in FIG. 1A can be the same as the semiconductor depicted in FIGS. 2-16.

Figure 2:
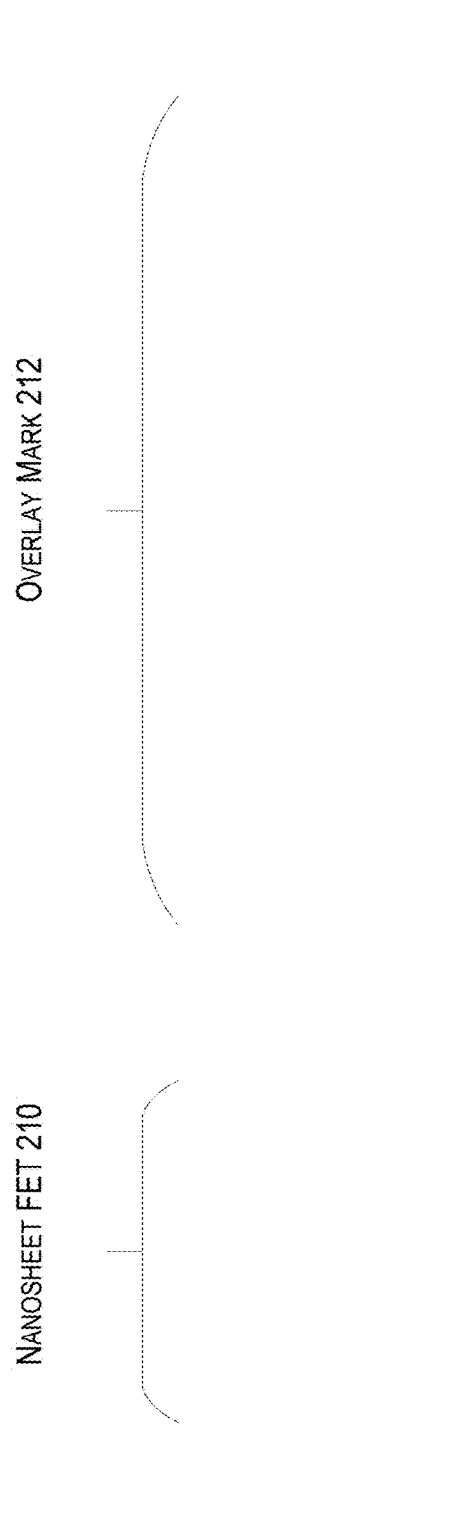
FIG. 2 illustrates a semiconductor device after the formation of the alternating layers of Si and SiGe layers over a substrate, in accordance with some embodiments.
Figure 2:
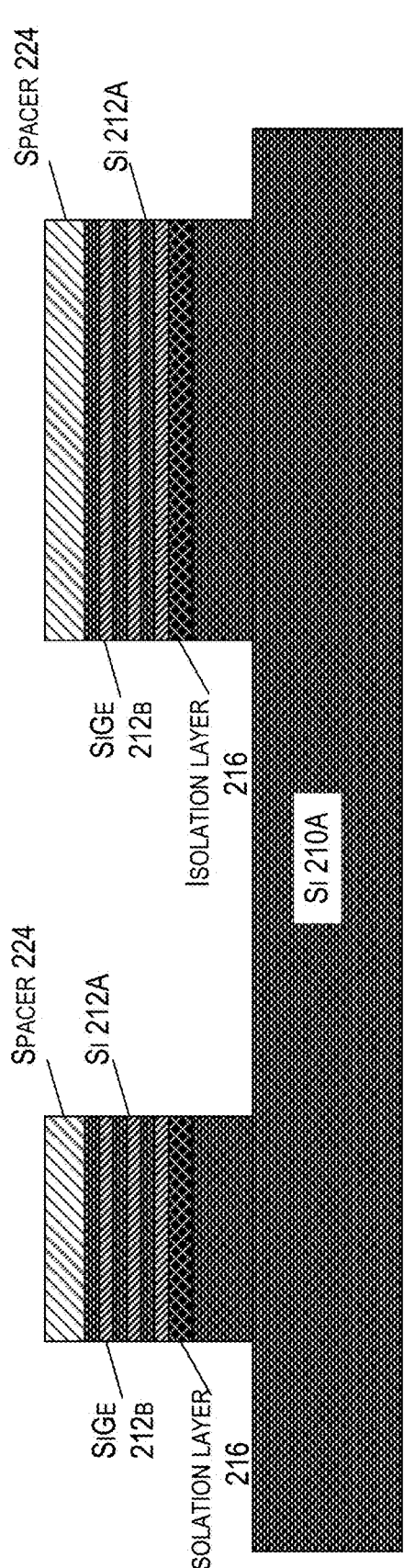

Referring to FIG. 2 now, a semiconductor device, which includes a nanosheet FET 210 and an overlay mark 212, after the formation of the alternating layers of Si and SiGe layers over a substrate is shown, consistent with an illustrative embodiment. The semiconductor device can include alternating layers of Si 212A and SiGe 212B to be used to form the plurality of nanosheets, formed over a substrate 210A.

In the illustrative example depicted in FIG. 2, the semiconductor device is depicted as being on silicon as a substrate 210A, while it will be understood that other types as substrates may be used as well, including, without limitation, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs), and quaternary (four elements, e.g., aluminum gallium indium phosphide (AlInGaP)) alloys.

In various embodiments, the substrate 210 may include any suitable material or combination of materials, such as doped or undoped silicon, glass, dielectrics, etc. For example, the substrate may include a silicon-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating film on top.

In various embodiments, an etch stop layer (not shown) is formed over the substrate 210. The etch stop layer can be a thin layer of material incorporated into the structure of the semiconductor device to provide a selective barrier against etching processes, preventing further removal of underlying materials during fabrication. The etch stop layer can enable precise control over the etching depth and helps define the desired device dimensions. The etch stop layer can further provide a stopping point for the etching process, ensuring that specific layers or regions are not etched beyond a certain point, leading to accurate patterning and control of critical features. The etch stop layer can create a distinct separation between different layers or components within the device structure, and prevent the undesired etching of underlying layers or materials, enabling the creation of complex, multi-layered structures with well-defined interfaces and boundaries. In some embodiments, the etch stop layer acts as a protective barrier for sensitive or delicate materials to shield such materials from aggressive etchants, preventing damage or degradation during subsequent fabrication steps.

In some embodiments, prior to forming the etch stop layer, the substrate 210 is prepared by cleaning and removing any impurities or oxide layers. The etch stop layer is deposited onto the substrate 210 using techniques such as chemical vapor deposition (CVD), physical vapor deposition (PVD), or atomic layer deposition (ALD). In an embodiment, a photoresist can be applied, exposed to a patterned mask, developed, and used as a protective layer to define the etch stop regions. The etch stop layer can then be selectively etched, stopping at a predetermined depth, while protecting the underlying layers. After the etching process, the remaining photoresist can be removed through stripping techniques. While in some embodiments, SiGe is used to form the etch stop layer, in some embodiments, silicon nitride (SiN) or silicon oxynitride (SiON) can be used as the etch stop layer.

The alternating layers of Si 210A and SiGe 210B can be heavily doped with donor impurities such as phosphorus or arsenic to provide an excess of electrons in an n-type semiconductor device. Similarly, in some embodiments, the alternating layers of Si 210A and SiGe 210B can be heavily doped with acceptor impurities such as boron or gallium.

An isolation layer 216 can be formed over the substrate 210. The isolation layer 216 can include silicon germanium and have a higher concentration of Ge compared to the SiGe layers 210B. In an embodiment, the Ge content of the isolation layer 216 is about 55% Ge. The alternating layers of Si 210A and SiGe 210B can be deposited using techniques such as thermal oxidation, CVD, or PVD.

In some embodiments, a spacer 224 is formed over the alternating layers of Si 210A and SiGe 210B. The spacer 224 can be a thin insulating layer or material that helps control the effective channel length of the semiconductor device. In various embodiments, the spacer 224 can allow for control over the channel's conductive properties, including resistance and carrier mobility, which can contribute to improved performance of the semiconductor device.

In some embodiments, the spacer 224 can act as insulating layers between the gate regions and the source/drain regions. That is, the spacer 224 can help prevent current leakage or short circuits between the gate regions and the source/drain regions. Such isolation can help maintain the integrity of the semiconductor device's electrical operation and prevent unintended current flow that could negatively impact the performance of the semiconductor device and reliability.

In further embodiments, the spacer 224 can be utilized to modulate the overlapping capacitance between the gate regions and the source/drain regions. Overlapping capacitance can affect the semiconductor device's electrical characteristics, such as threshold voltage and switching behavior. Thus, by adjusting the thickness and material properties of the spacer 224, the overlapping capacitance can be optimized, which can allow for better control and modulation of the semiconductor device's behavior.

In several embodiments, the spacer 224 can help mitigate the short-channel effects by physically separating the gate regions from the source/drain regions. To that end, the spacer 224 can create a barrier that restricts the extension of the electric field into the channel region, reducing the impact of drain-induced barrier lowering and subthreshold leakage. This mitigation can improve the semiconductor device's performance, reduce power consumption, and enhance overall device reliability.

In an embodiment, the spacer 224 can serve as barriers that prevent the lateral diffusion of dopant atoms from the source/drain regions into the channel region during the doping process. Such diffusion can alter the channel characteristics and compromise the semiconductor device's performance. By confining the dopant diffusion, the spacer 224 can contribute to maintaining the desired semiconductor device's characteristics and electrical behavior. The spacer can be made of silicon nitride.

Figure 3:
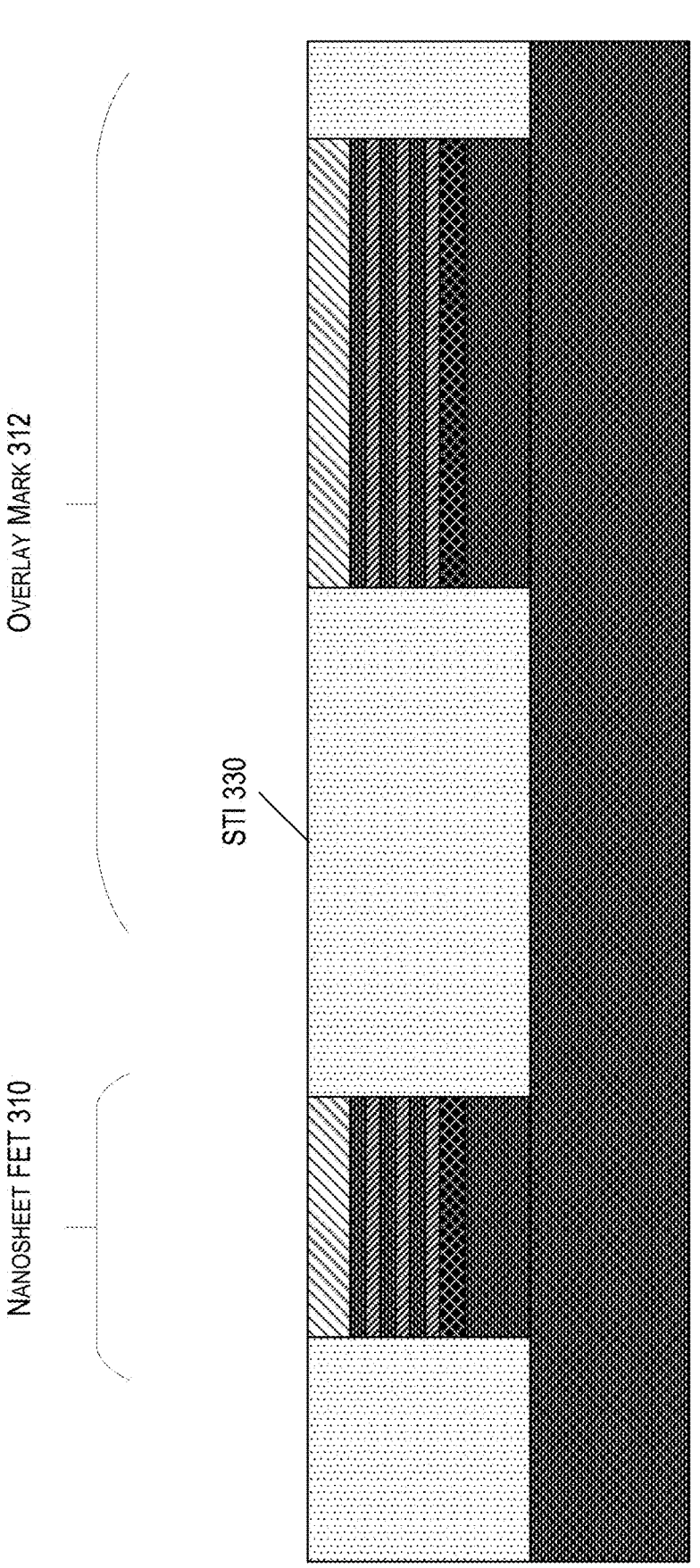
FIG. 3 illustrates a semiconductor device after filling the shallow trench isolation, in accordance with some embodiments.

FIG. 3 illustrates a semiconductor device, which includes a nanosheet FET 310 and an overlay mark 312 after filling the STI, in accordance with some embodiments. The STI 330 can be filled over the nanosheet FET 310 and the overlay mark 312. In some embodiments, a chemical mechanical polishing (CMP) is performed on the semiconductor device to polish the surface of the semiconductor device and remove the contaminant.

Figure 4:
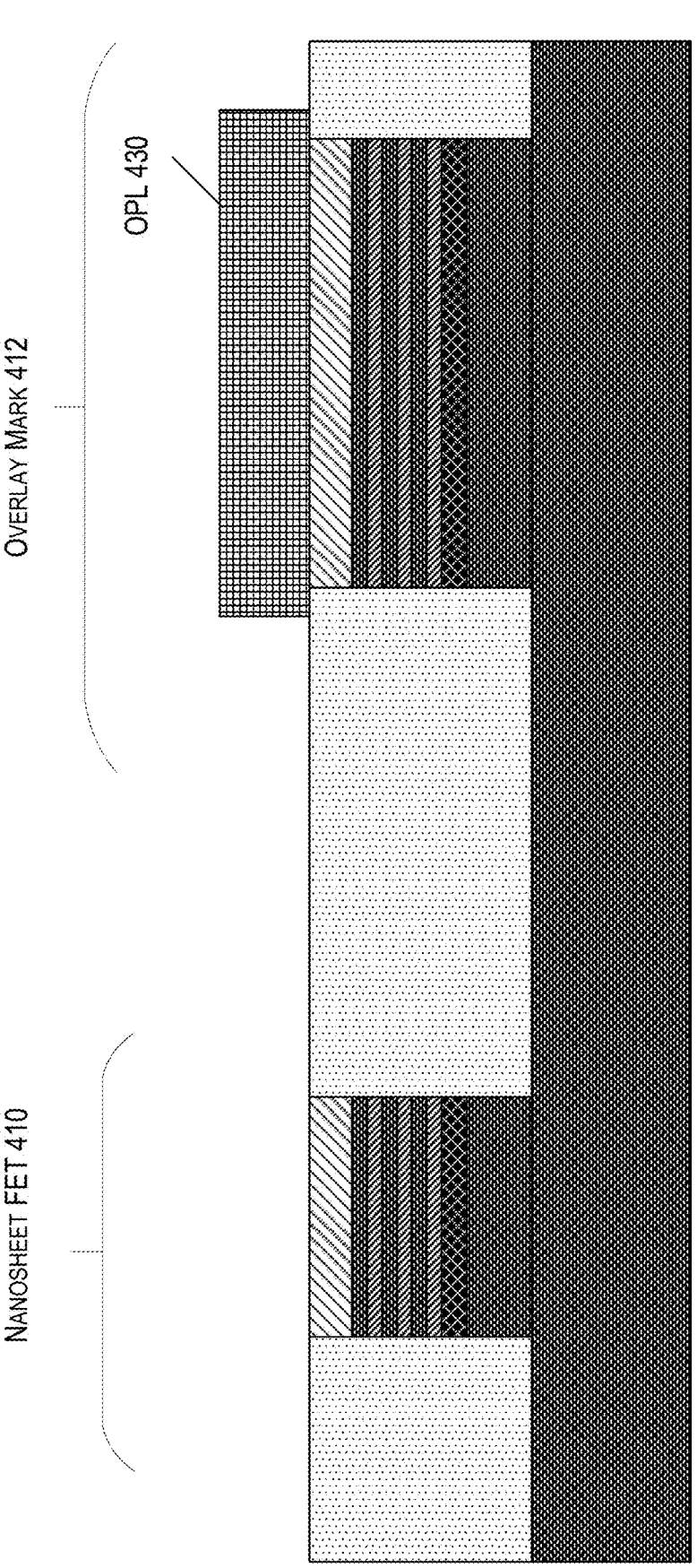
FIG. 4 illustrates a semiconductor device after a zero-layer lithography, in accordance with some embodiments.

FIG. 4 illustrates a semiconductor device, which includes a nanosheet FET 410 and an overlay mark 412 after a zero-layer lithography, in accordance with some embodiments. In some embodiments, an organic planarization layer, OPL, 430 is formed over the overlay mark 412. The OPL 430 can include a photo-sensitive organic polymer having a light-sensitive material that, when exposed to electromagnetic radiation, is chemically altered and thus configured to be removed using a developing solvent. For example, in some embodiments, the photo-sensitive organic polymer can be polyacrylate resin, epoxy resin, phenol resin, polyamide resin, polyimide resin, unsaturated polyester resin, polyphenylene ether resin, polyphenylene sulfide resin, or benzocyclobutene (BCB). In some embodiments, the OPL 430 can include any organic polymer and a photoactive compound having a molecular structure that can attach to the molecular structure of the organic polymer. In some embodiments, the OPL 430 material is selected to be compatible with an overlying antireflective coating (not shown) and/or an overlying photoresist (not shown). In some embodiments, the OPL 430 can be applied using spin coating technology, although other techniques are within the contemplated scope of the present disclosure.

Figure 5:
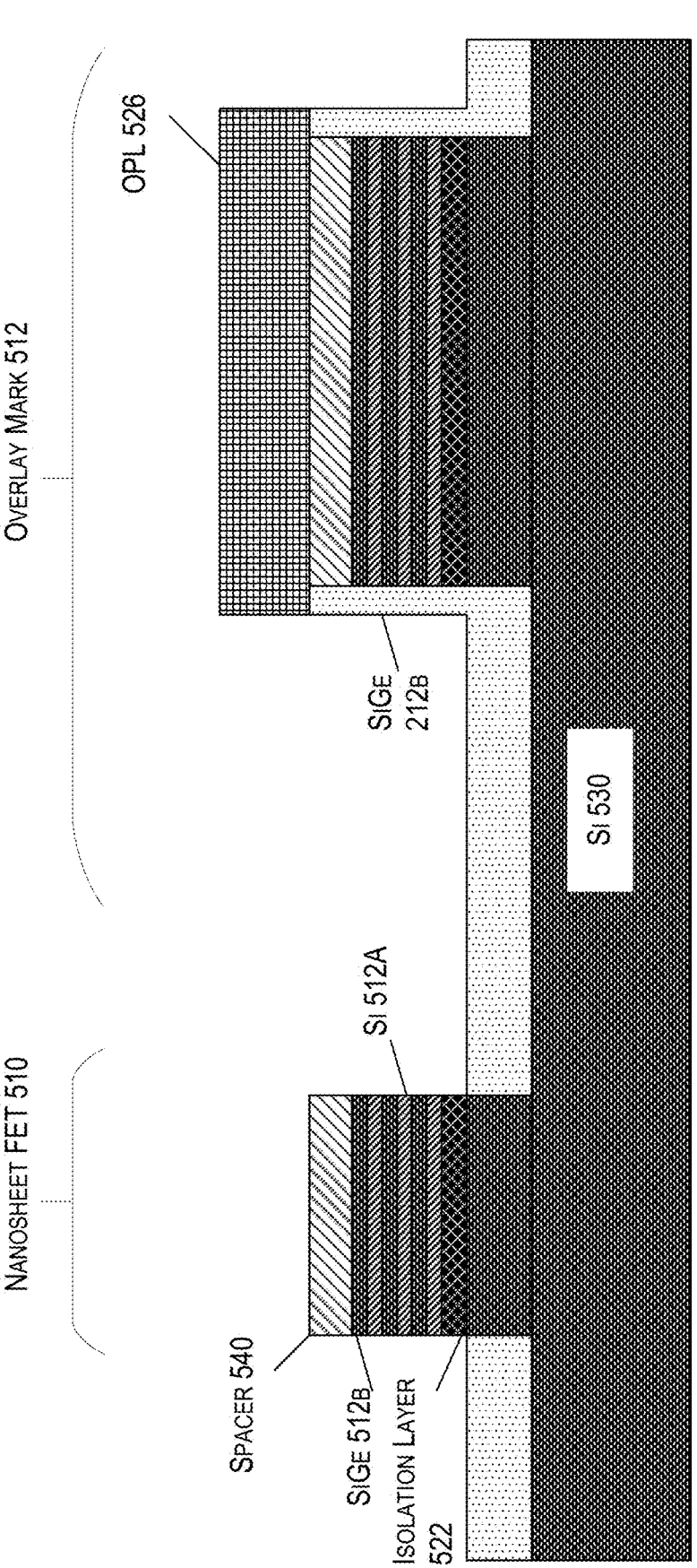
FIG. 5 illustrates a semiconductor device after the fin removal, in accordance with some embodiments.

FIG. 5 illustrates a semiconductor device, which includes a nanosheet FET 510 and an overlay mark 512, after the fin removal, in accordance with some embodiments. In some embodiments, the OPL 526 is removed from the overlay mark 512. In some embodiments, portions of the STI are removed. The removal process stops at the substrate 530, thus, the spacer 540, the layers of Si 512A and SiGe 512B, and the isolation layer 522 are exposed.

Figure 6:
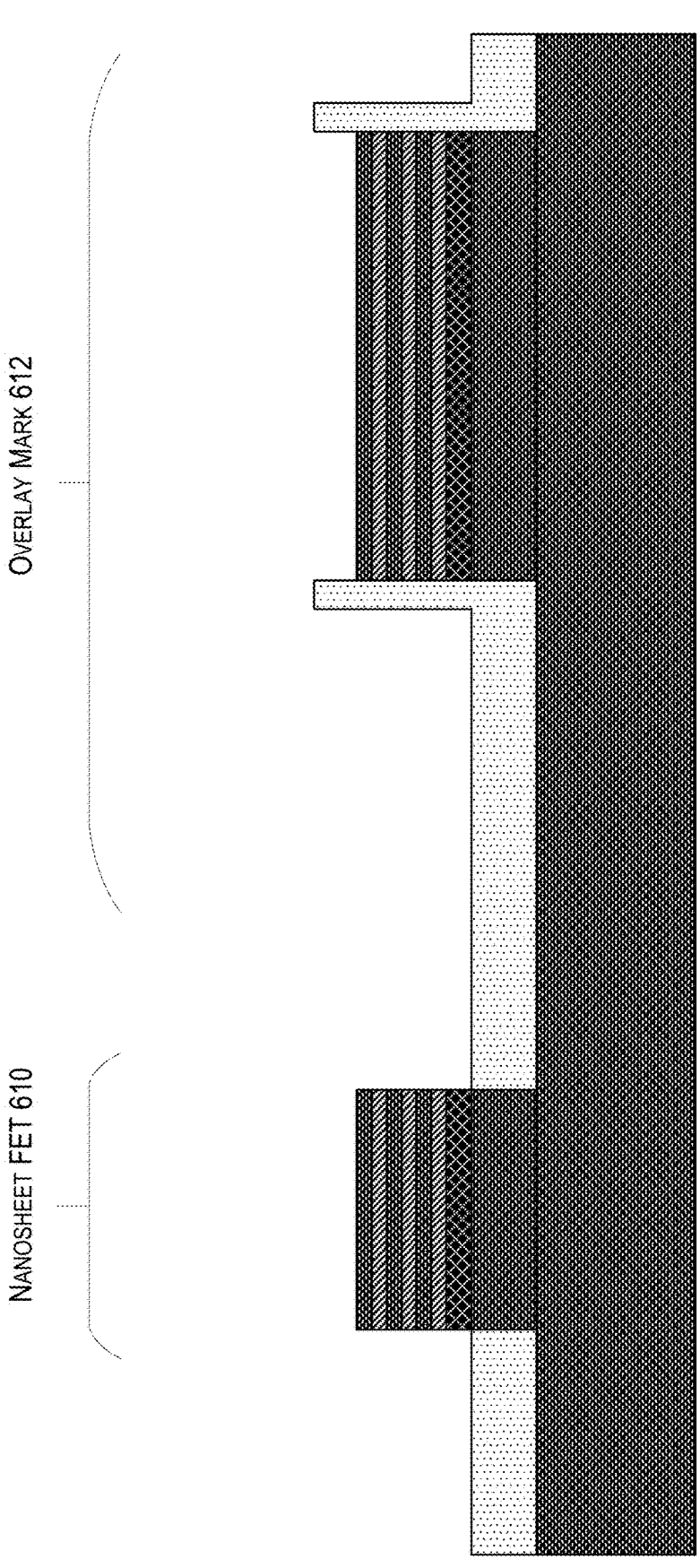
FIG. 6 illustrates a semiconductor device after the removal of the organic planarization layer (OPL), in accordance with some embodiments.

FIG. 6 illustrates a semiconductor device, which includes a nanosheet FET 610 and an overlay mark 612, after the removal of the spacer, in accordance with some embodiments. In some embodiments, the spacer from the nanosheet FET 610 and the overlay mark 612 is removed.

Figure 7A:
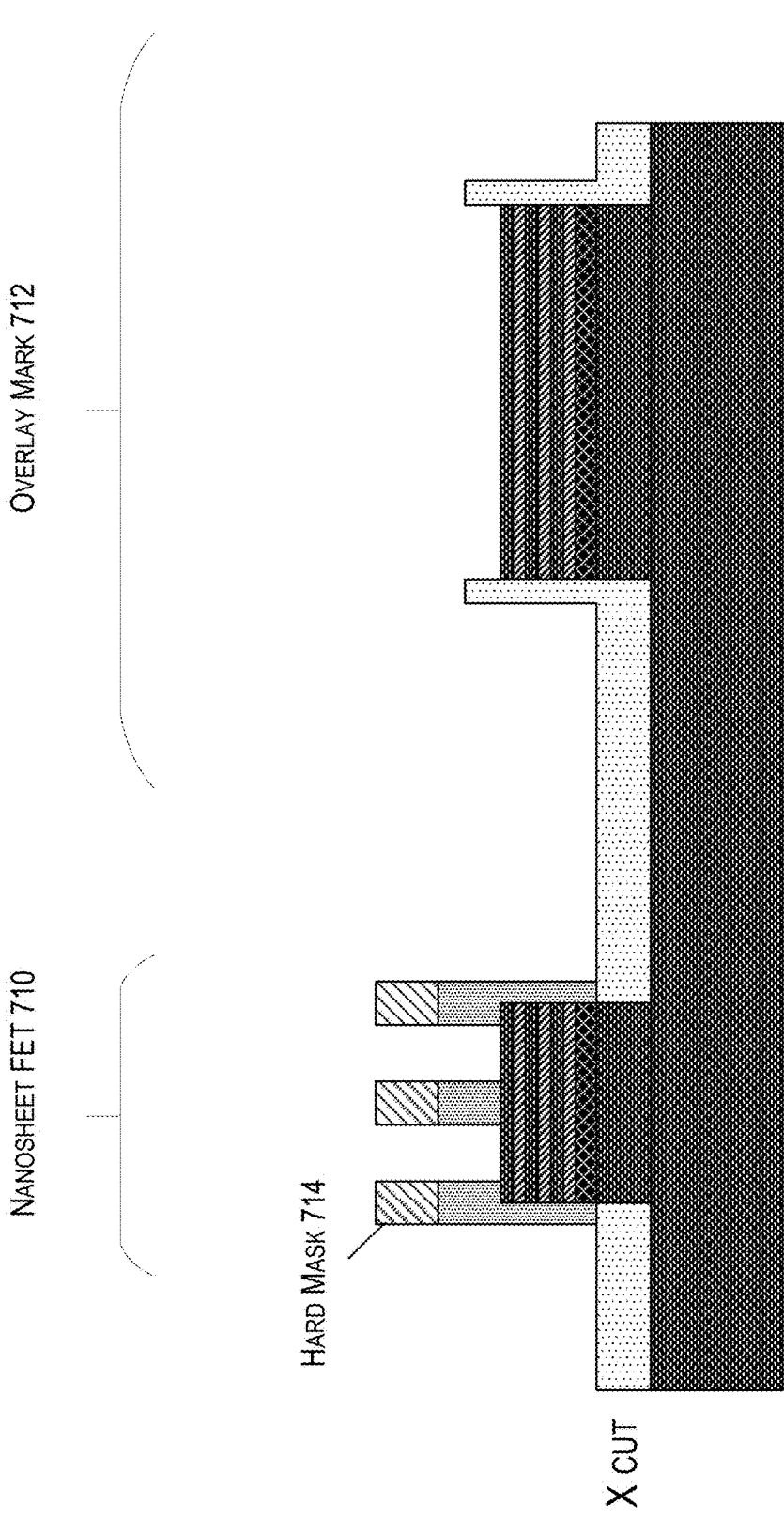
FIGS. 7A-7B illustrate a semiconductor device after the removal of the spacer, in accordance with some embodiments.
Figure 7B:
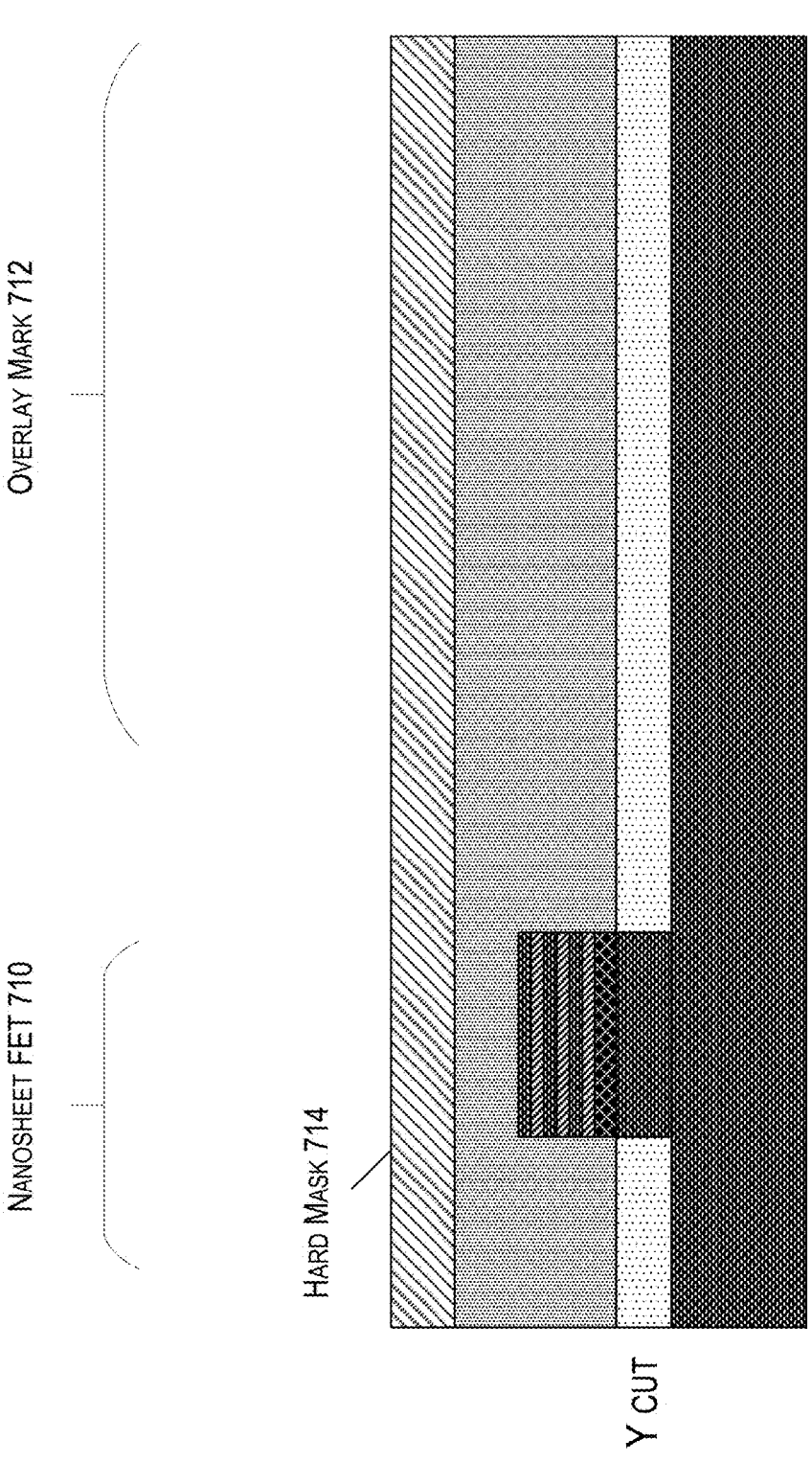

FIG. 7A illustrates an X-section view of a semiconductor device, which includes a nanosheet FET 710 and an overlay mark 712, after the dummy gate patterning, in accordance with some embodiments. In some embodiments, the dummy gate patterning can include forming a hard mask 714. The hard mask 714 can be a thin layer of material to act as a protective layer and to enable precise pattern transfer to the underlying layers during various fabrication steps and aid in pattern transfer. The hard mask 714 can act as a template for defining the desired patterns on the underlying layers, and provide a protective layer that withstands subsequent etching or deposition processes, ensuring precise pattern transfer with high fidelity. In various embodiments, the hard mask 714 resists etchants that are aggressive towards the underlying layers, preventing their undesired removal or damage. In additional embodiments, the hard mask 714 serves as a barrier between different fabrication steps, allowing compatibility with subsequent processes. In order to form the hard mask 714, the hard mask material is deposited onto the semiconductor device using techniques such as CVD, PVD, or ALD. Silicon nitride (SiN) and silicon oxide (SiO2) can be used as hard masks. FIG. 7B illustrates a Y-section view of the semiconductor device.

Figure 8A:
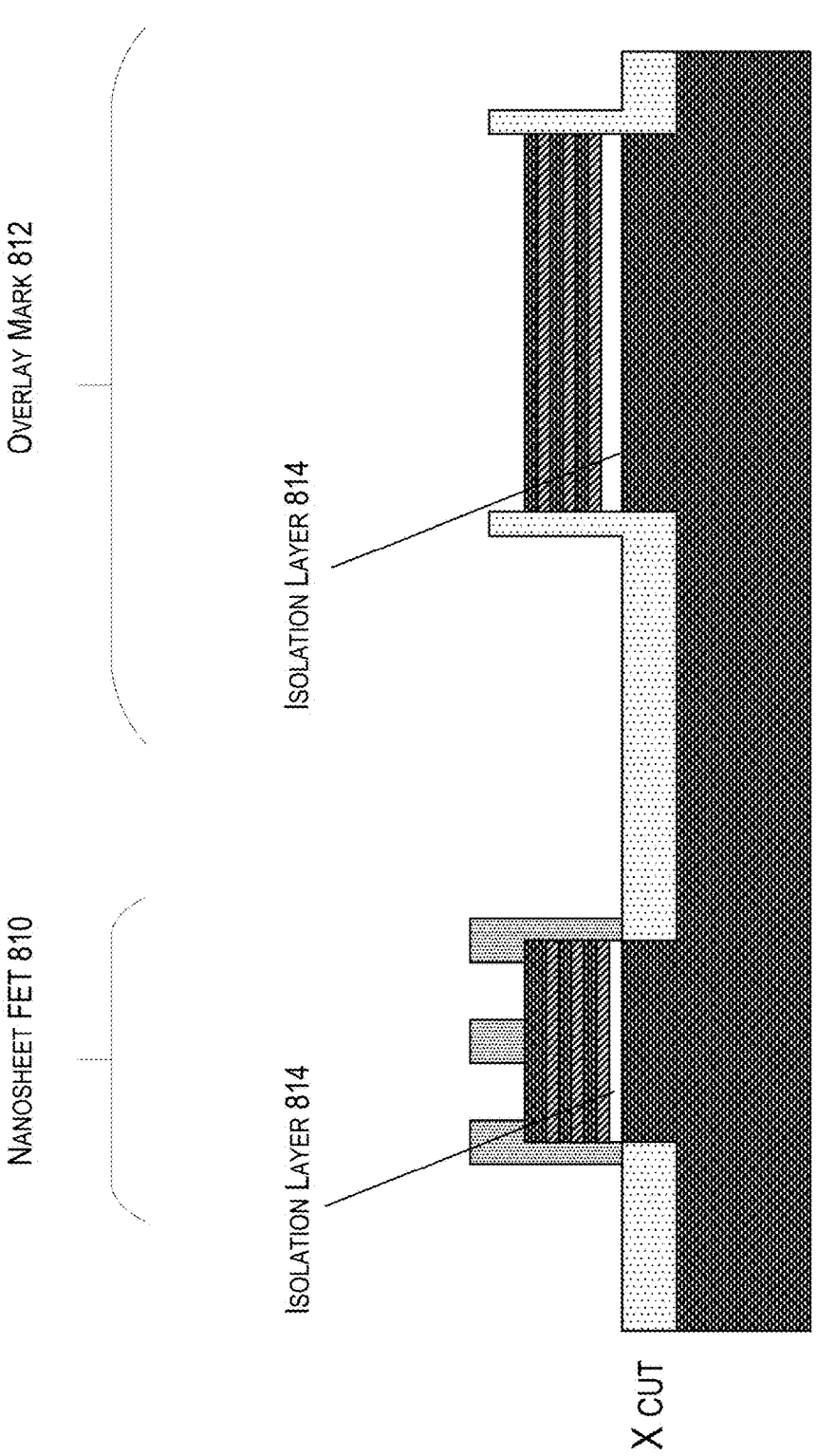
FIGS. 8A-8B illustrate a semiconductor device after the dummy gate patterning, in accordance with some embodiments.
Figure 8B:
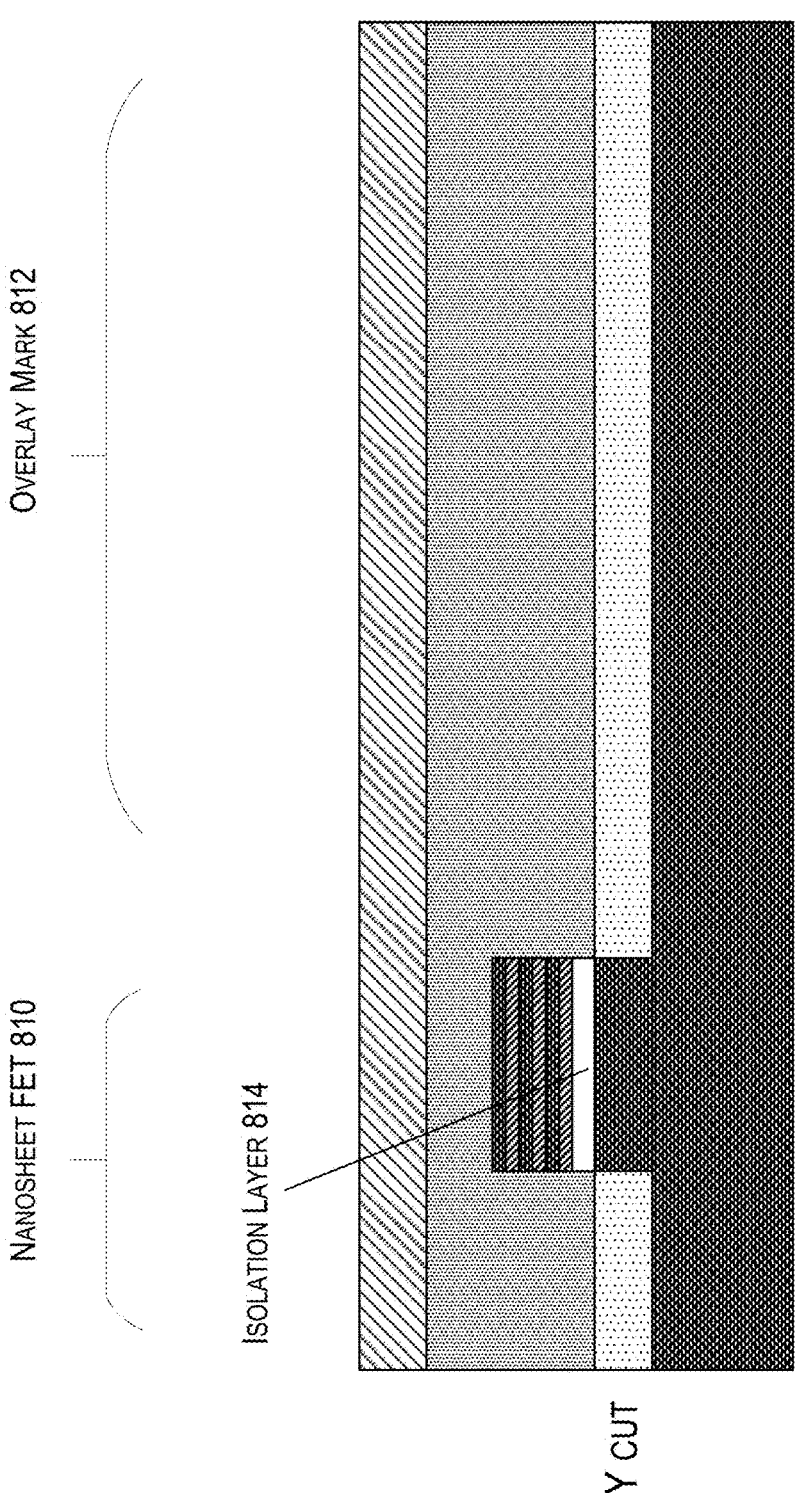

FIG. 8A illustrates an X-section of the semiconductor device, which includes a nanosheet FET 810 and an overlay mark 812, after the removal of the isolation layer, in accordance with some embodiments. In some embodiments, the isolation layer is removed from the top surface of the substrate 814 in the overlay mark 812 and the nanosheet FET 810. FIG. 8B illustrates a Y-section view of the semiconductor device.

Figure 9A:
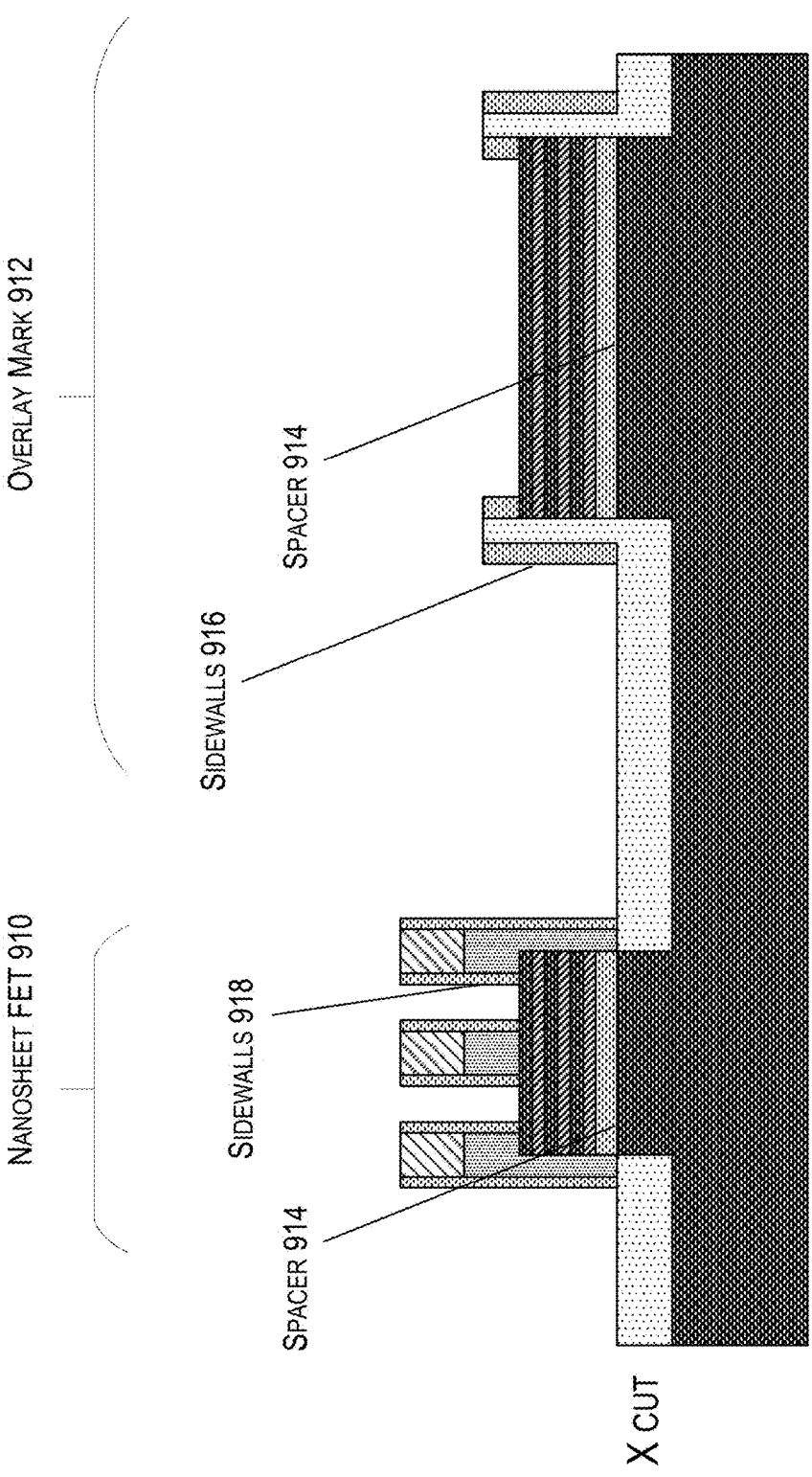
FIGS. 9A-9B illustrate a semiconductor device after the removal of the isolation layer, and the inner spacer is formed, in accordance with some embodiments.
Figure 9B:
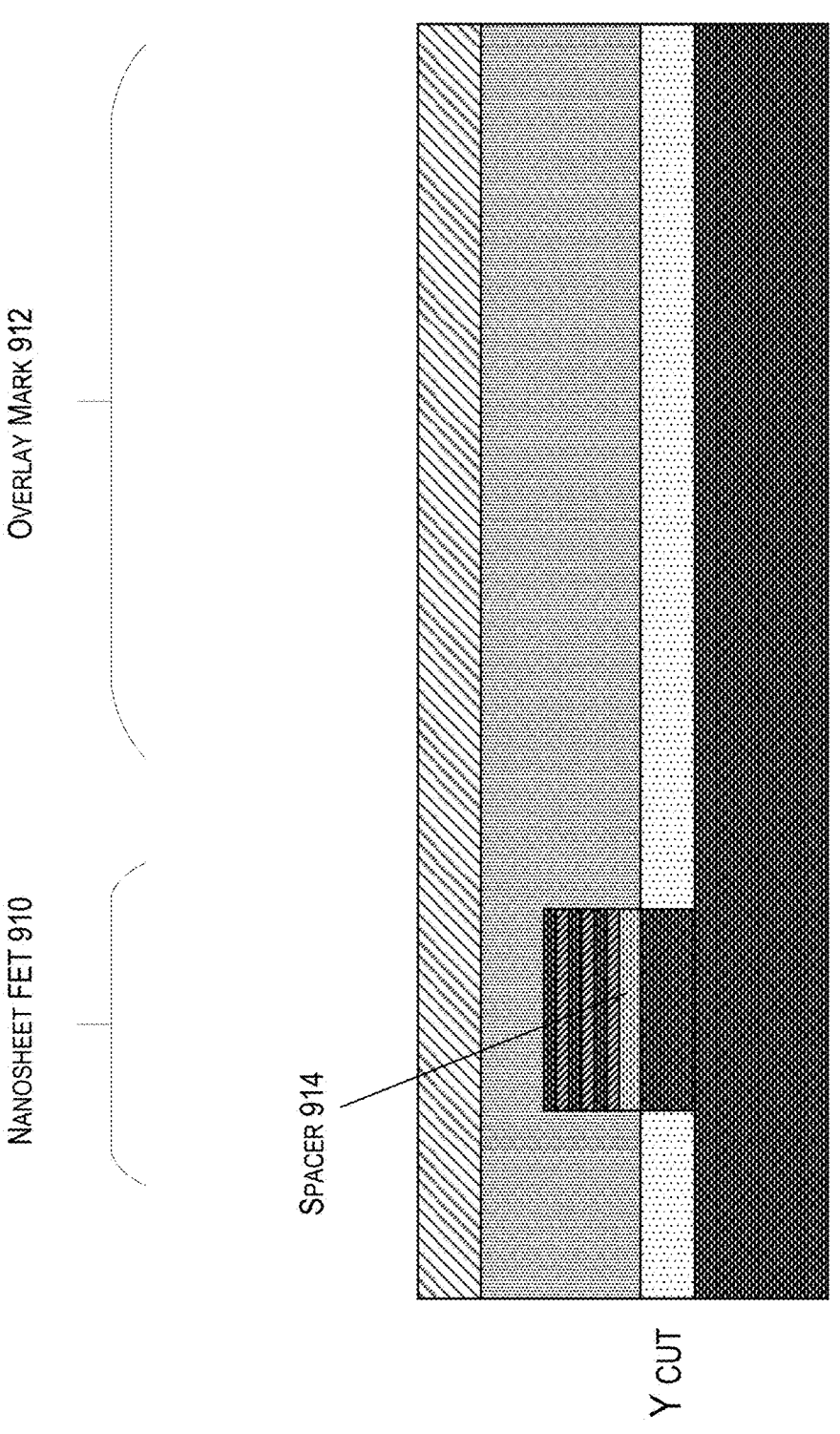

FIG. 9A illustrates an X-section view of the semiconductor device, which includes a nanosheet FET 910 and an overlay mark 912, after the spacer formation, in accordance with some embodiments. In some embodiments, the spacer 914 is formed over the substrate. In other words, the spacer 914 substitutes the isolation layer over the substrate. The spacer 914 can further form over the sidewalls 916 of the middle section of the overlay mark 912 and the sidewalls 918 of the dummy gates over the nanosheet FET 910. As such, the spacer 914 is isolated from direct contact with the middle section of the overlay mark 912 via the STI. FIG. 9B illustrates a Y-section view of the semiconductor device.

Figure 10A:
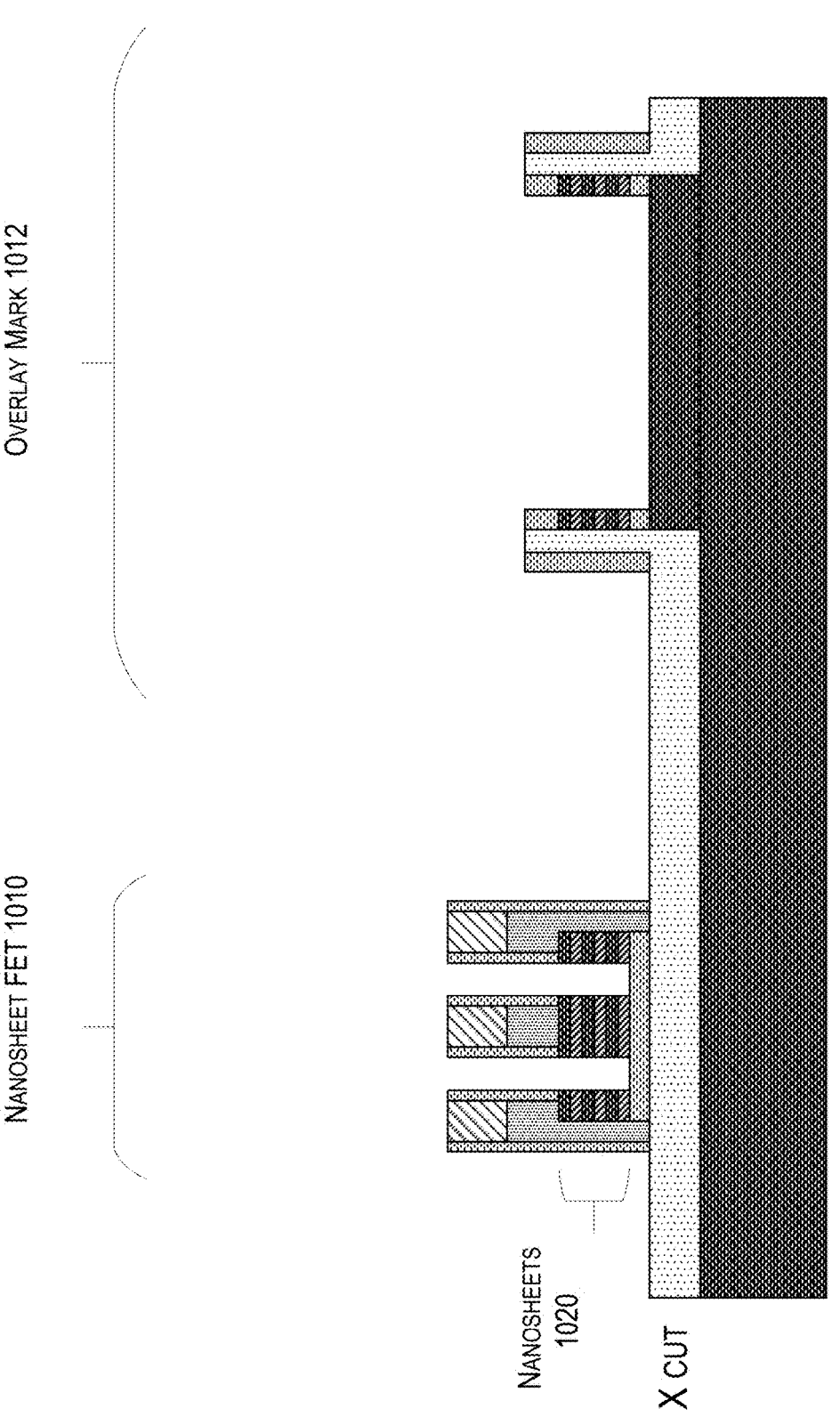
FIGS. 10A-10B illustrate a semiconductor device after the formation of the spacer, in accordance with some embodiments.
Figure 10B:
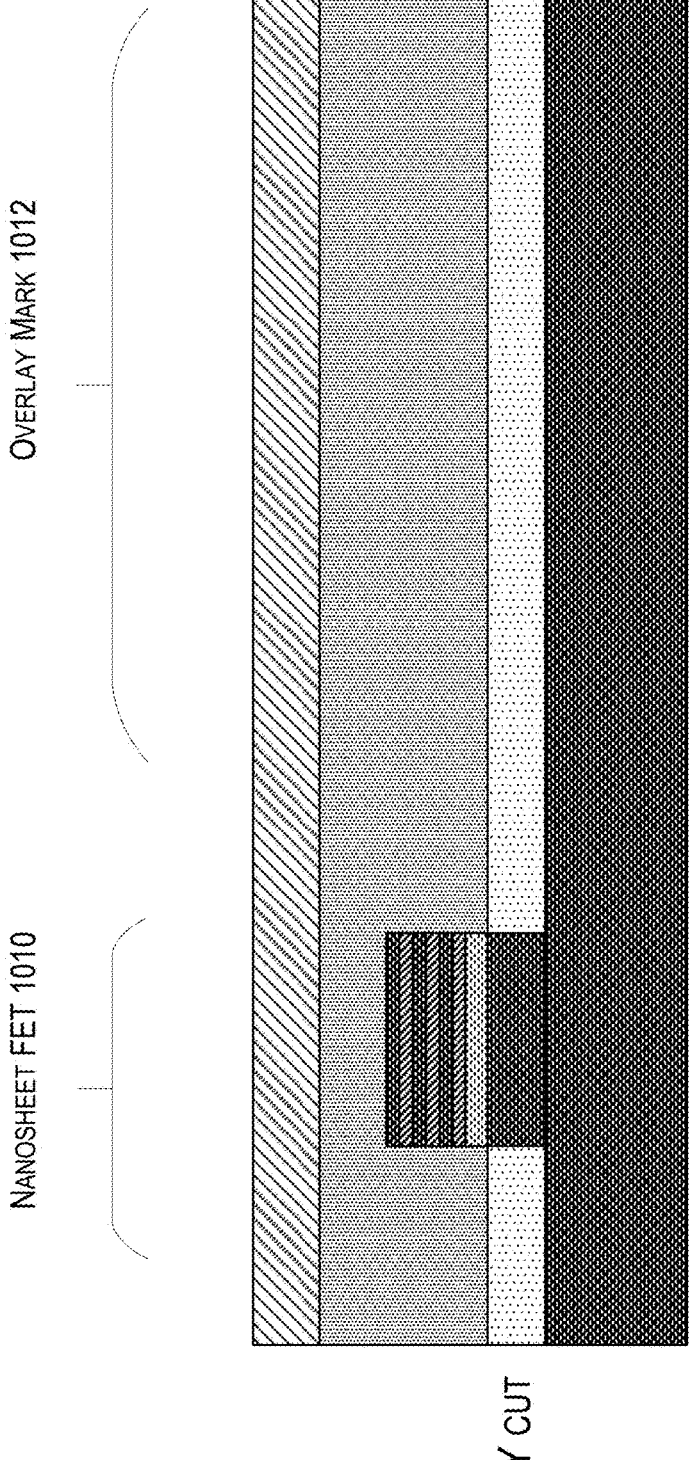

FIG. 10A illustrates an X-section view of the semiconductor device, which includes a nanosheet FET 1010 and an overlay mark 1012, after the nanosheet formation, in accordance with some embodiments. In some embodiments, portions of the alternating layers of Si and SiGe are removed to form the nanosheets 1020, exposing the spacer in the nanosheet FET 1010. Further, portions of the alternating layers of Si and SiGe over the substrate are removed in the overlay mark 1012, thus exposing the substrate. FIG. 10B illustrates a Y-section view of the semiconductor device.

Figure 11A:
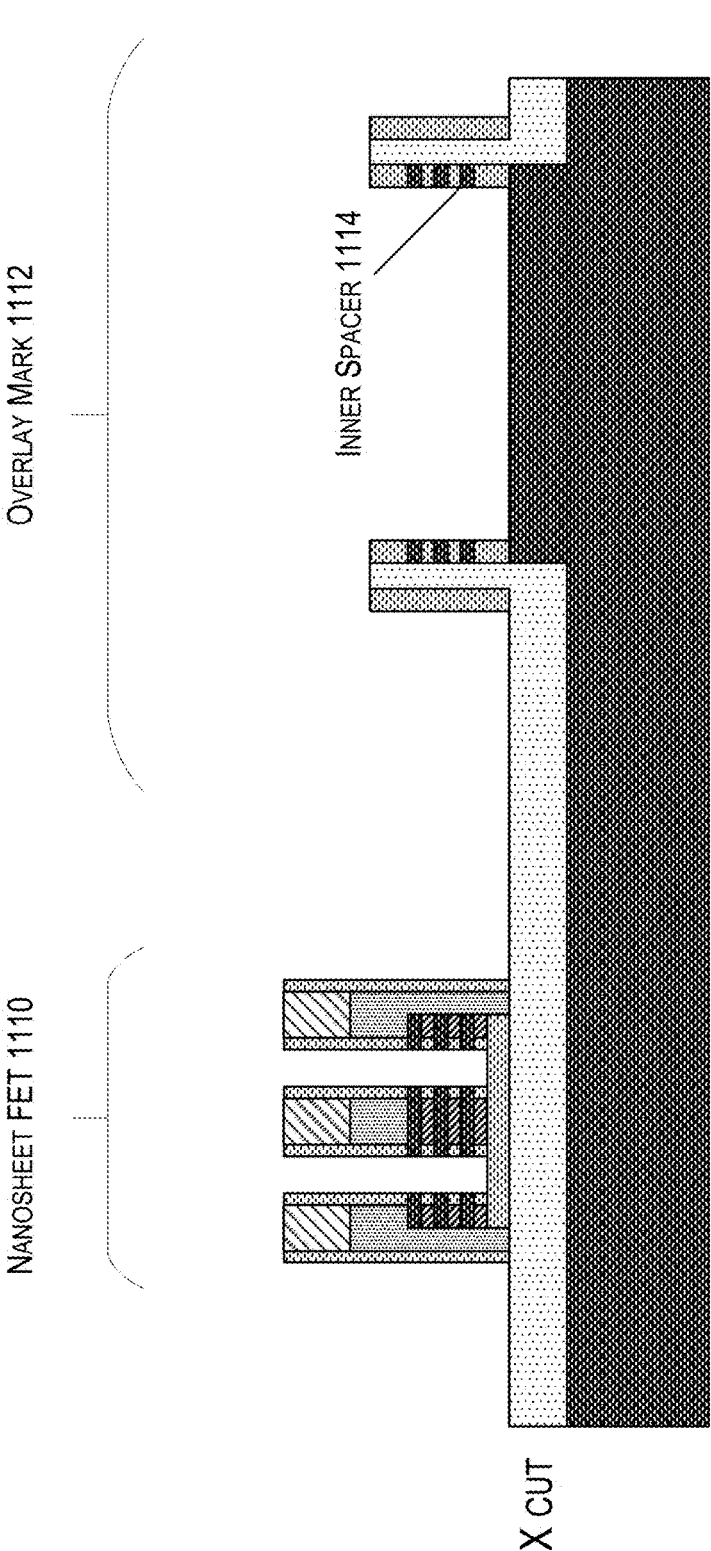
FIGS. 11A-11B illustrate a semiconductor device after the formation of the nanosheets, in accordance with some embodiments.
Figure 11B:
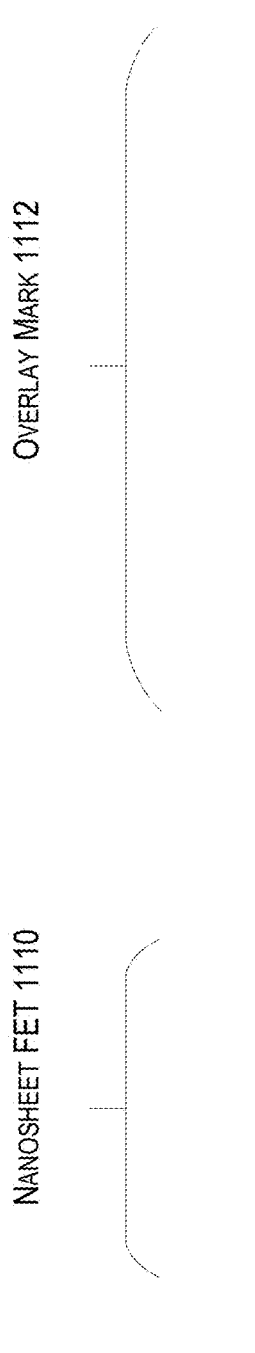
Figure 11B:
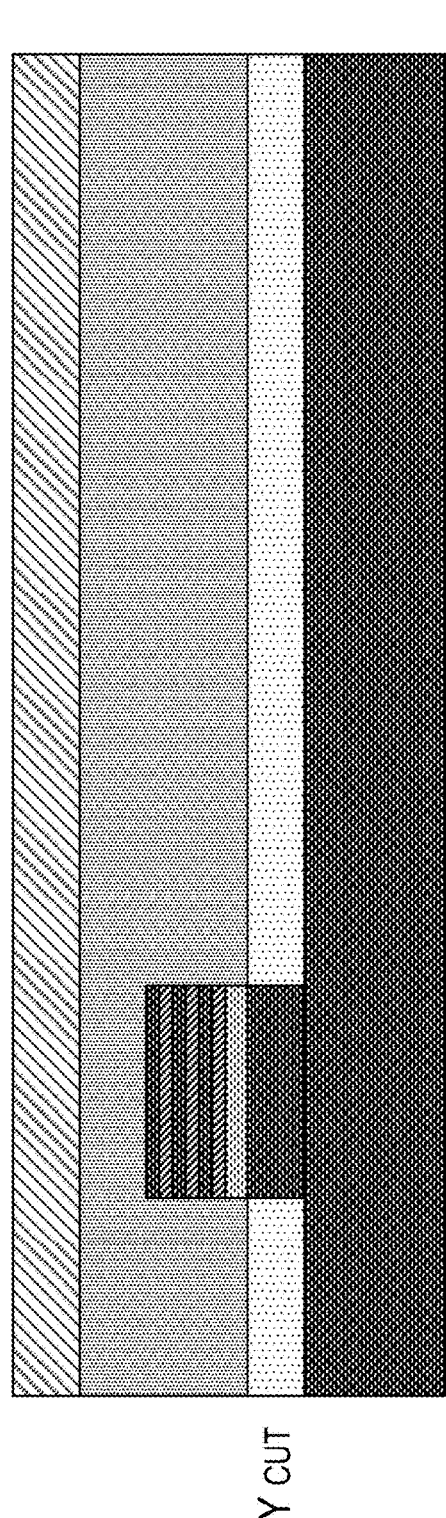

FIG. 11A illustrates an X-section view of the semiconductor device, which includes a nanosheet FET 1110 and an overlay mark 1112, after the inner spacer formation, in accordance with some embodiments. As shown in FIG. 11B, in some embodiments, the SiGe layers of the alternating layers of Si and SiGe are removed and the inner spacers 1114 are formed in the spaces formed. The inner spacer 1114 can act as an insulating layer and can be made of the same material as the spacer. FIG. 11B illustrates a Y-section view of the semiconductor device.

Figure 12A:
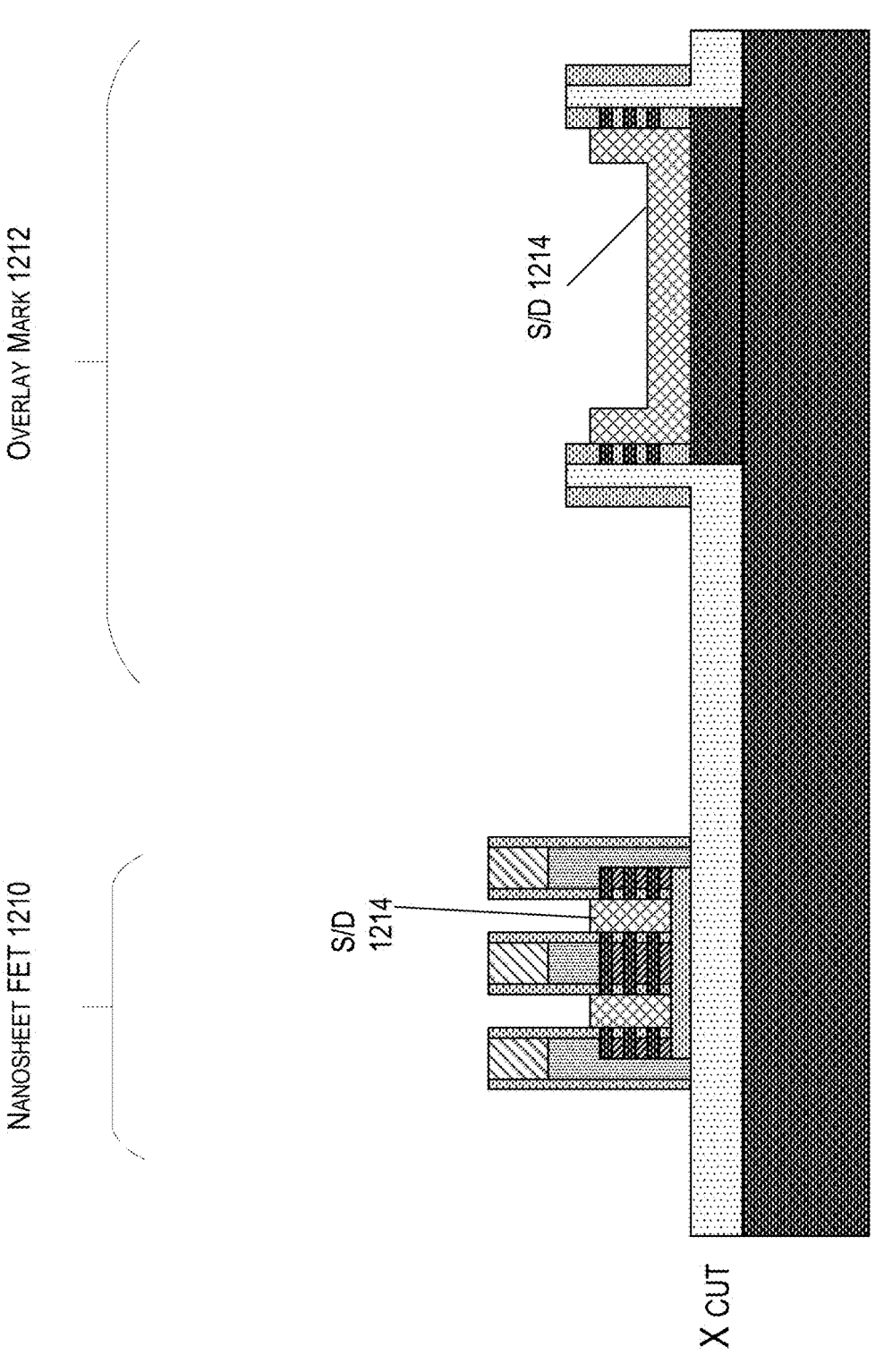
FIGS. 12A-12B illustrate a semiconductor device after the formation of the inner spacer, in accordance with some embodiments.
Figure 12B:
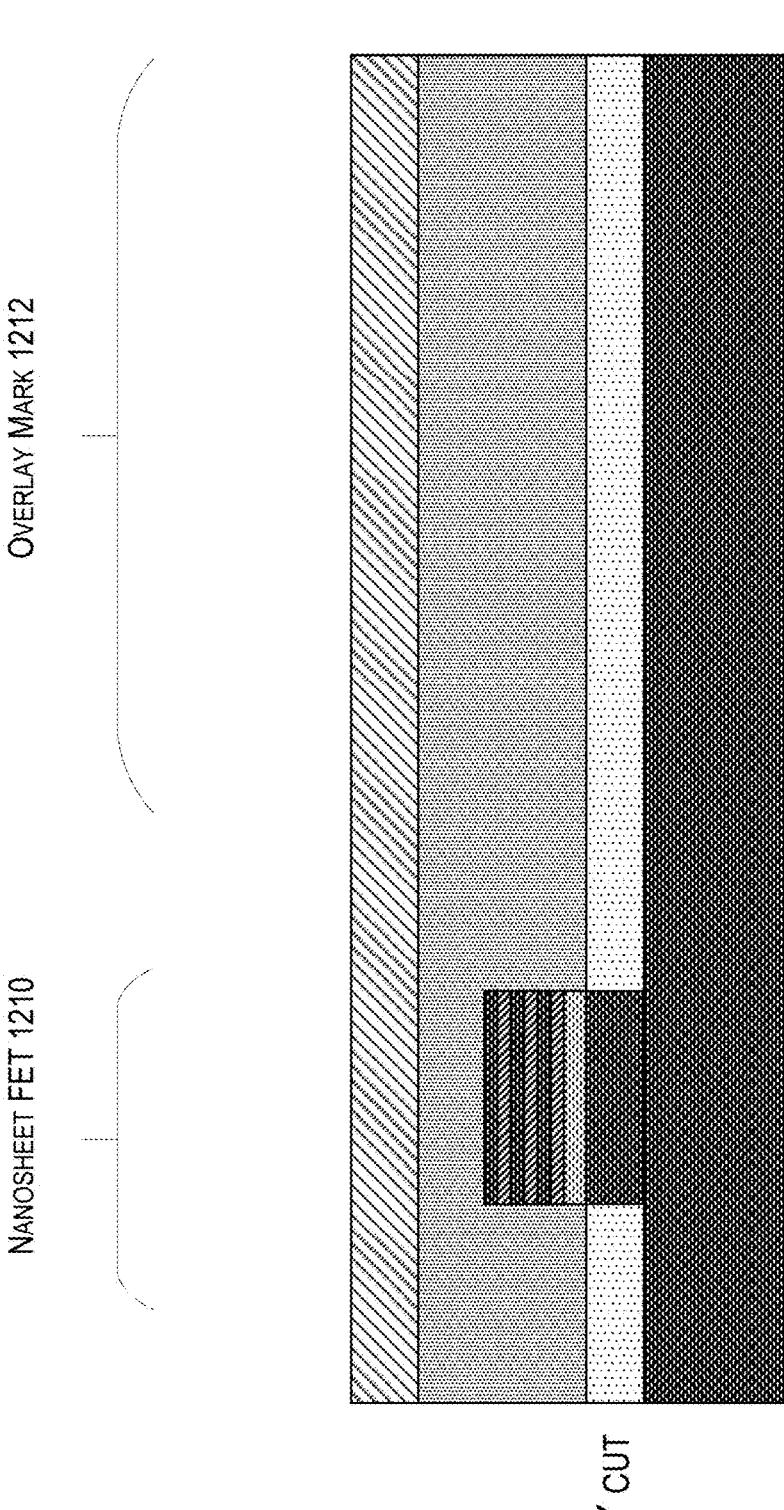

FIG. 12A illustrates an X-section view of the semiconductor device, which includes a nanosheet FET 1210 and an overlay mark 1212, after the source/drain region formation, in accordance with some embodiments. FIG. 12B illustrates a Y-section view of the semiconductor device. As shown in FIG. 12B, in some embodiments, the source/drain region 1214 is formed between the nanosheets and over the spacers in the nanosheet FET 1210 and over the substrate in the overlay mark 1212, as shown in FIG. 12B. The source/drain region 1214 can be made of silicon or silicon germanium.

Figure 13A:
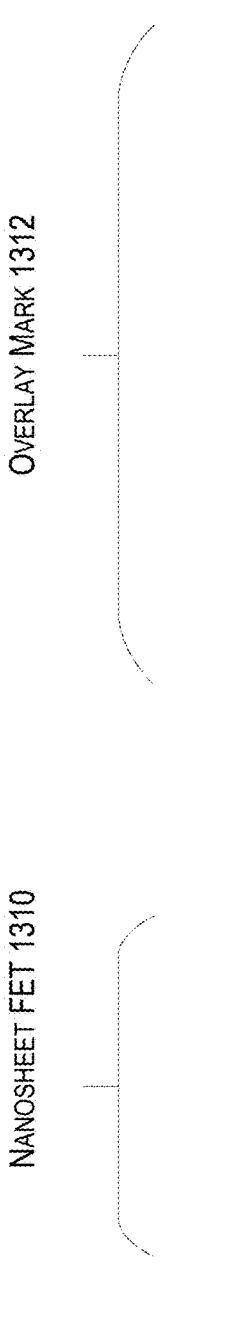
FIGS. 13A-13B illustrate a semiconductor device after the formation of the source/drain region, in accordance with some embodiments.
Figure 13A:
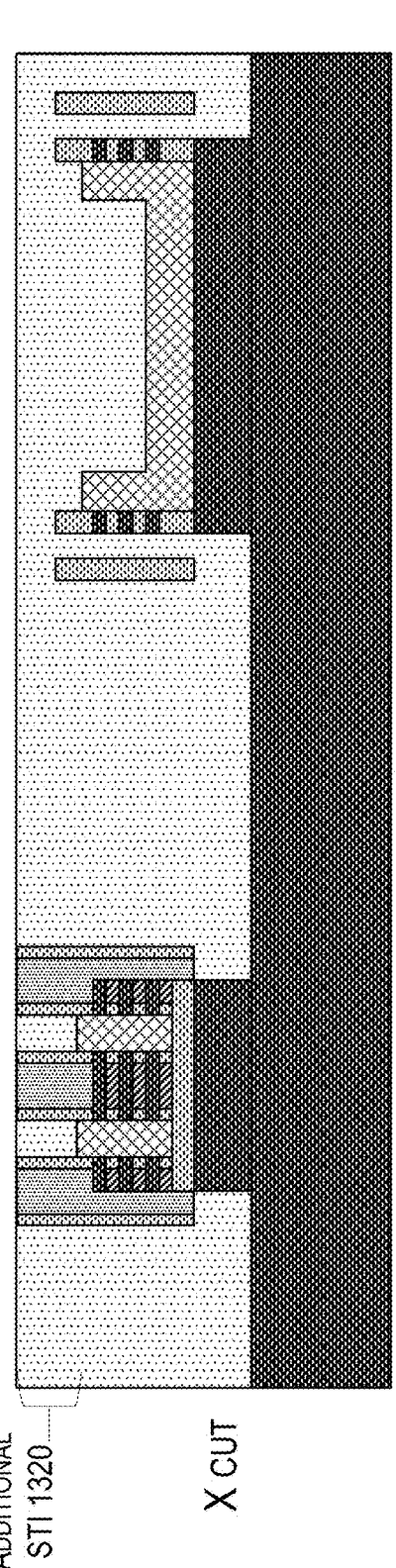
Figure 13B:
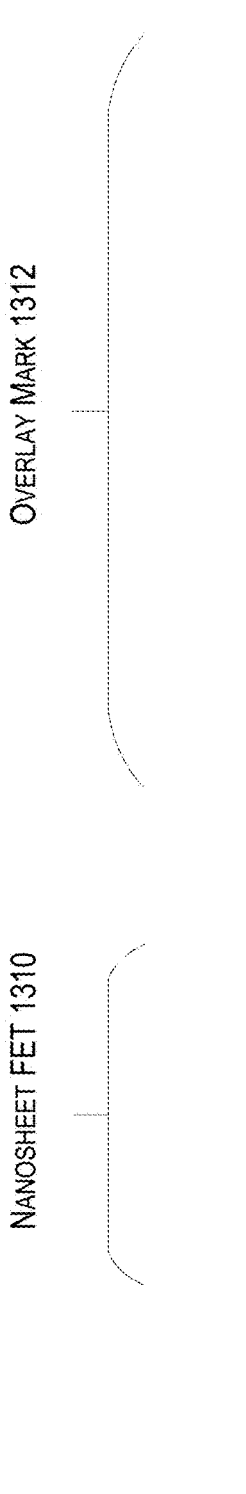
Figure 13B:
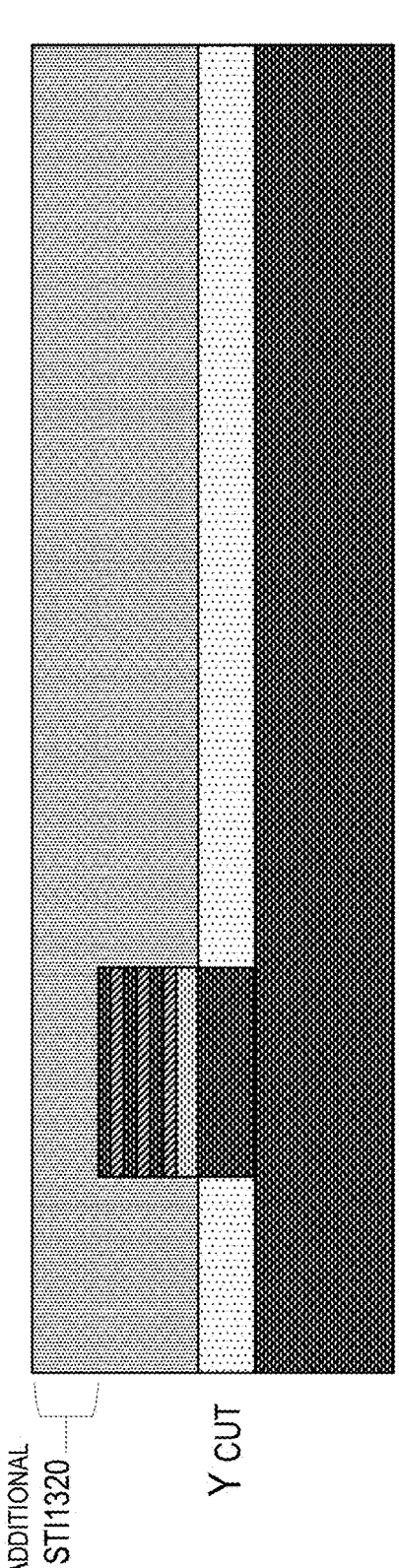

FIG. 13A illustrates an X-section view of the semiconductor device, which includes a nanosheet FET 1310 and an overlay mark 1312, after additional STI formation 1320, in accordance with some embodiments. FIG. 13B illustrates a Y-section view of the semiconductor device. In some embodiments, additional STI is formed over the semiconductor device to encapsulate the nanosheet FET 1310 and the overlay mark 1312. STI can be a layer of insulating material to electrically isolate and provide mechanical support between different layers of conducting and active components. STI can enable efficient signal transmission, reduce crosstalk, and ensure the proper functioning of the semiconductor device. STI can electrically isolate adjacent conducting layers or active components in the semiconductor device. By providing insulation between different layers, STI prevents electrical shorts, minimizes leakage current, and ensures that signals are directed only along the desired pathways. In some embodiments, STI can help reduce parasitic capacitance between adjacent metal interconnects or active devices and provide mechanical support to the integrated circuit structure.

The STI can be deposited onto the substrate using various techniques such as CVD, spin-on deposition, plasma-enhanced CVD (PECVD), or ALD. In some embodiments, after deposition, planarization techniques are employed to ensure a flat and smooth surface. In an embodiment, chemical mechanical polishing (CMP) can be used to remove excess material and achieve a uniform surface topography. In some embodiments, silicon dioxide (SiO2), or a low-k dielectric, e.g., organosilicates, fluorinated silicates, or porous materials, can be used as STI. Alternatively, polymer-based materials, such as polyimide or polybenzoxazole (PBO), can be used as STI.

Figure 14A:
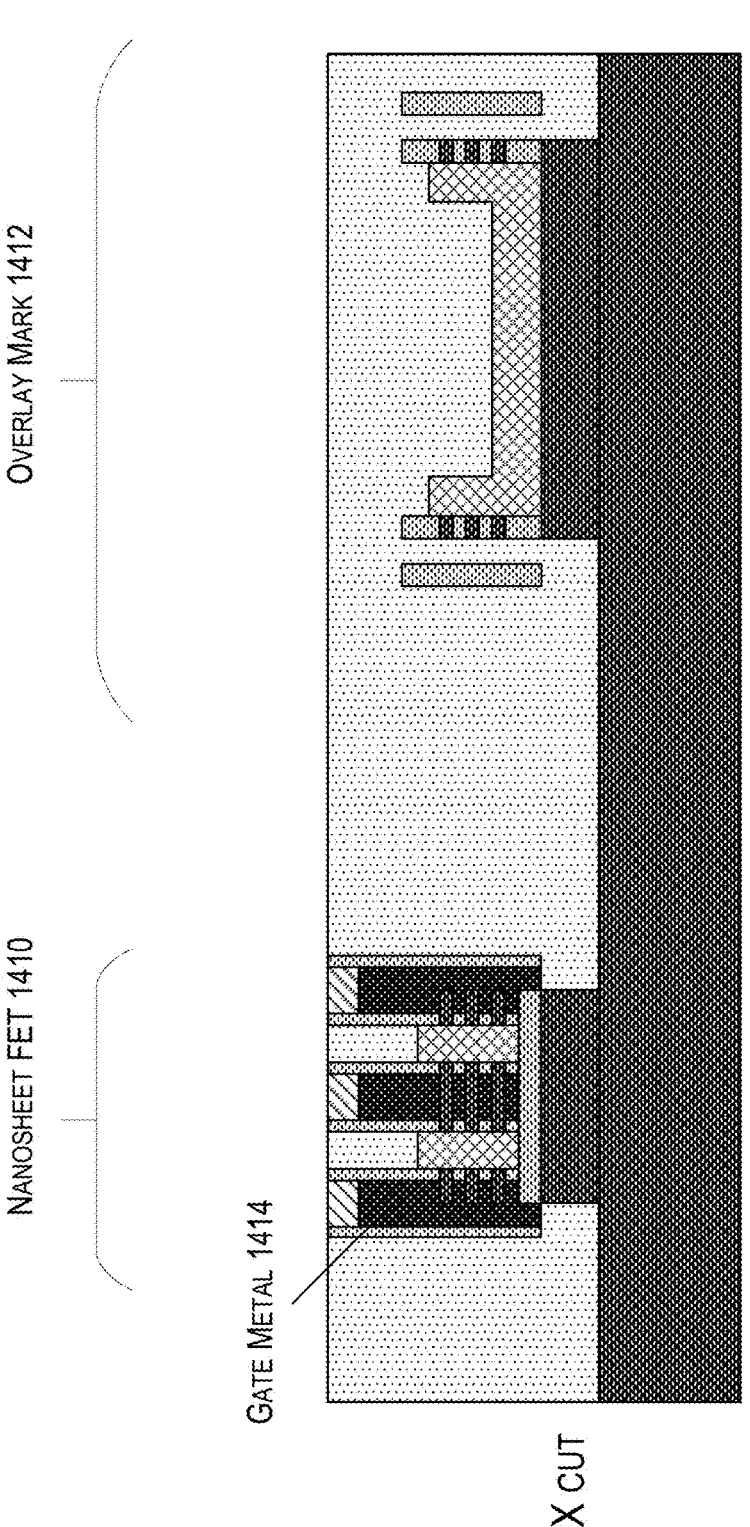
FIGS. 14A-14B illustrate a semiconductor device after the formation of additional STI, in accordance with some embodiments.
Figure 14B:
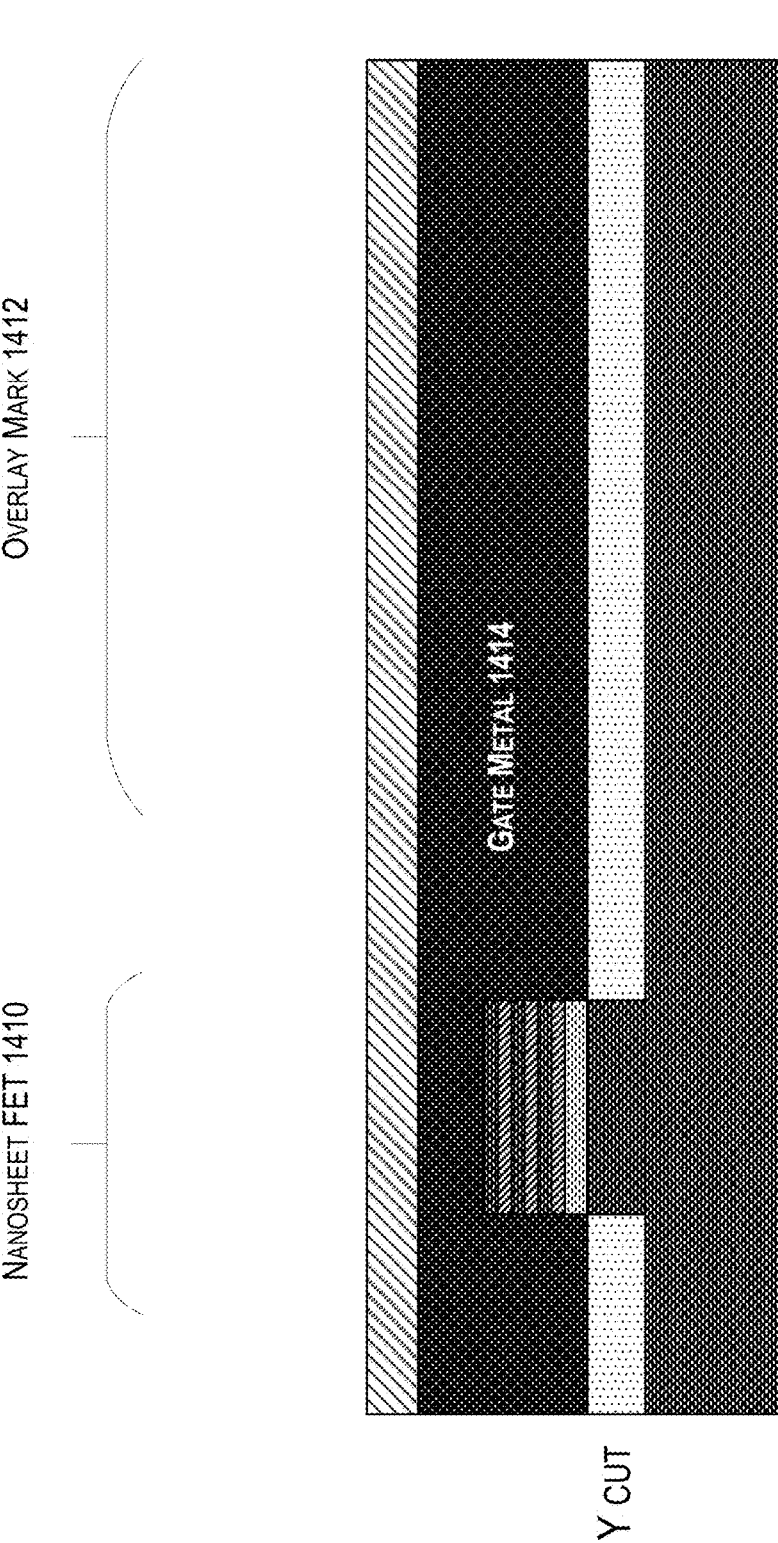

FIG. 14A illustrates an X-section view of the semiconductor device, which includes a nanosheet FET 1410 and an overlay mark 1412, after gate metal formation, in accordance with some embodiments. FIG. 14B illustrates a Y-section view of the semiconductor device. In some embodiments, the dummy gate is removed and the gate metal 1414 is formed. The gate metal can be an electrically conductive metal added to control current flow in field-effect transistors as the primary on/off switch. The metal gate can include a doped polysilicon film directly formed on the thin gate dielectric. The metal gate can include metals such as tungsten or tantalum.

Figure 15A:
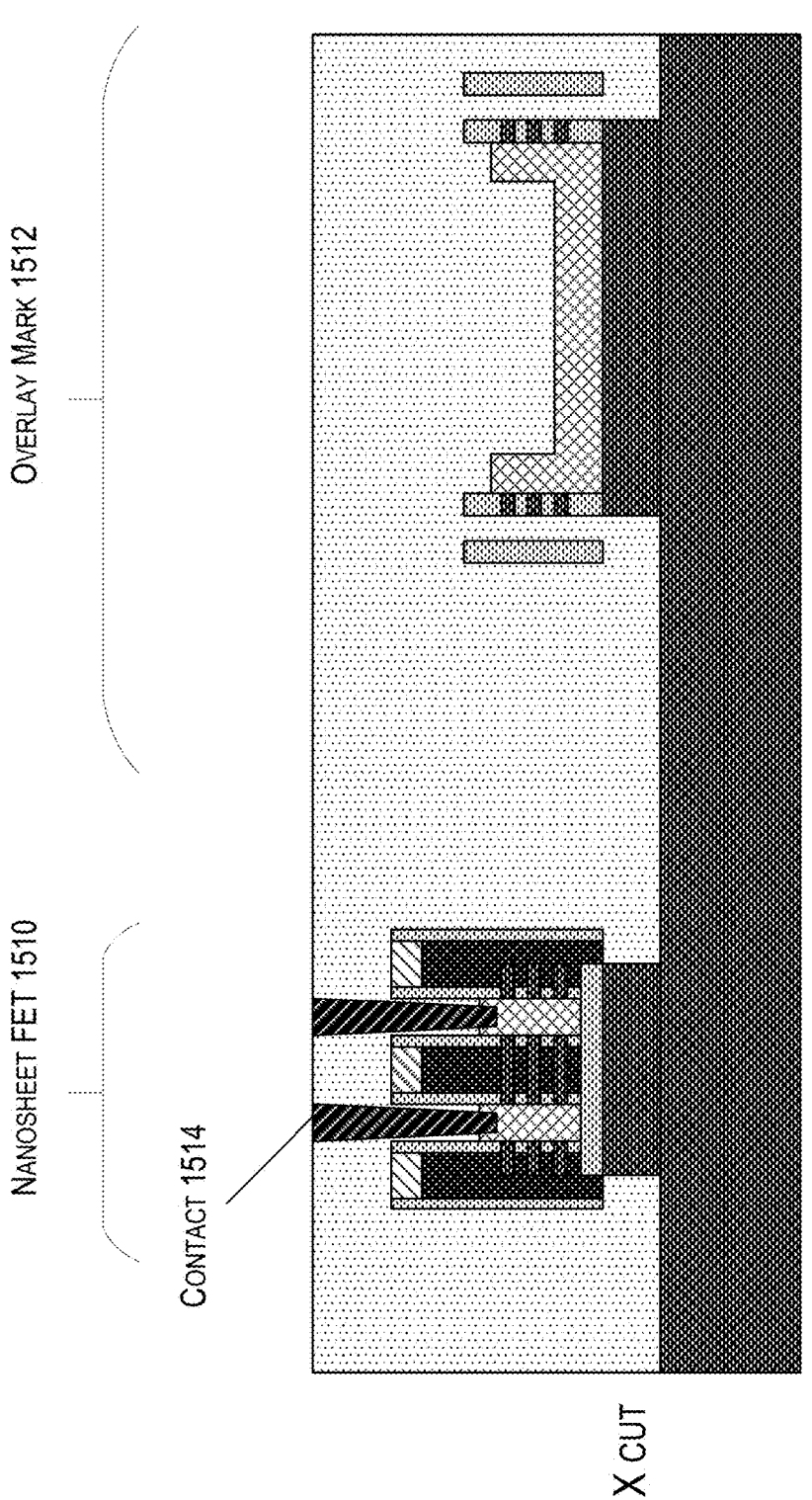
FIGS. 15A-15B illustrate a semiconductor device after the formation of the metal gate, in accordance with some embodiments.
Figure 15B:
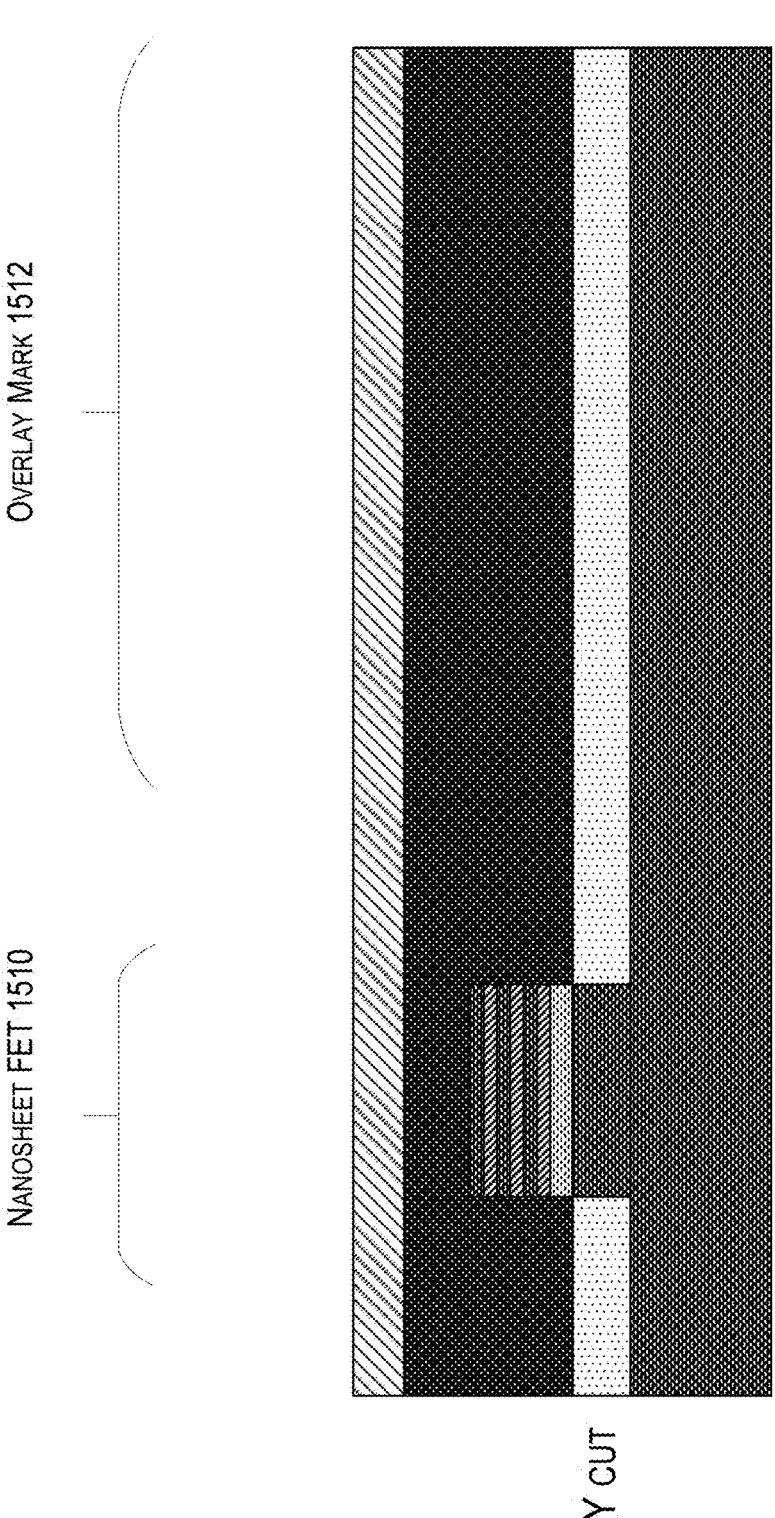

FIG. 15A illustrates an X-section view of the semiconductor device, which includes a nanosheet FET 1510 and an overlay mark 1512, after contact formation, in accordance with some embodiments. FIG. 15B illustrates the Y-section view of the semiconductor device. In some embodiments, the contacts 1514 are formed to connect the source/drain regions within the semiconductor and/or to other components on other semiconductor devices. In an embodiment, additional dielectric is deposited to encapsulate the nanosheet FET 1510 and the overlay mark 1512.

FIGS. 16-25 illustrate various acts in the manufacture of a semiconductor device, consistent with illustrative embodiments. It is also worth mentioning that the semiconductor depicted in FIG. 1B can be the same as the semiconductor depicted in FIGS. 16-25.

Figure 16A:
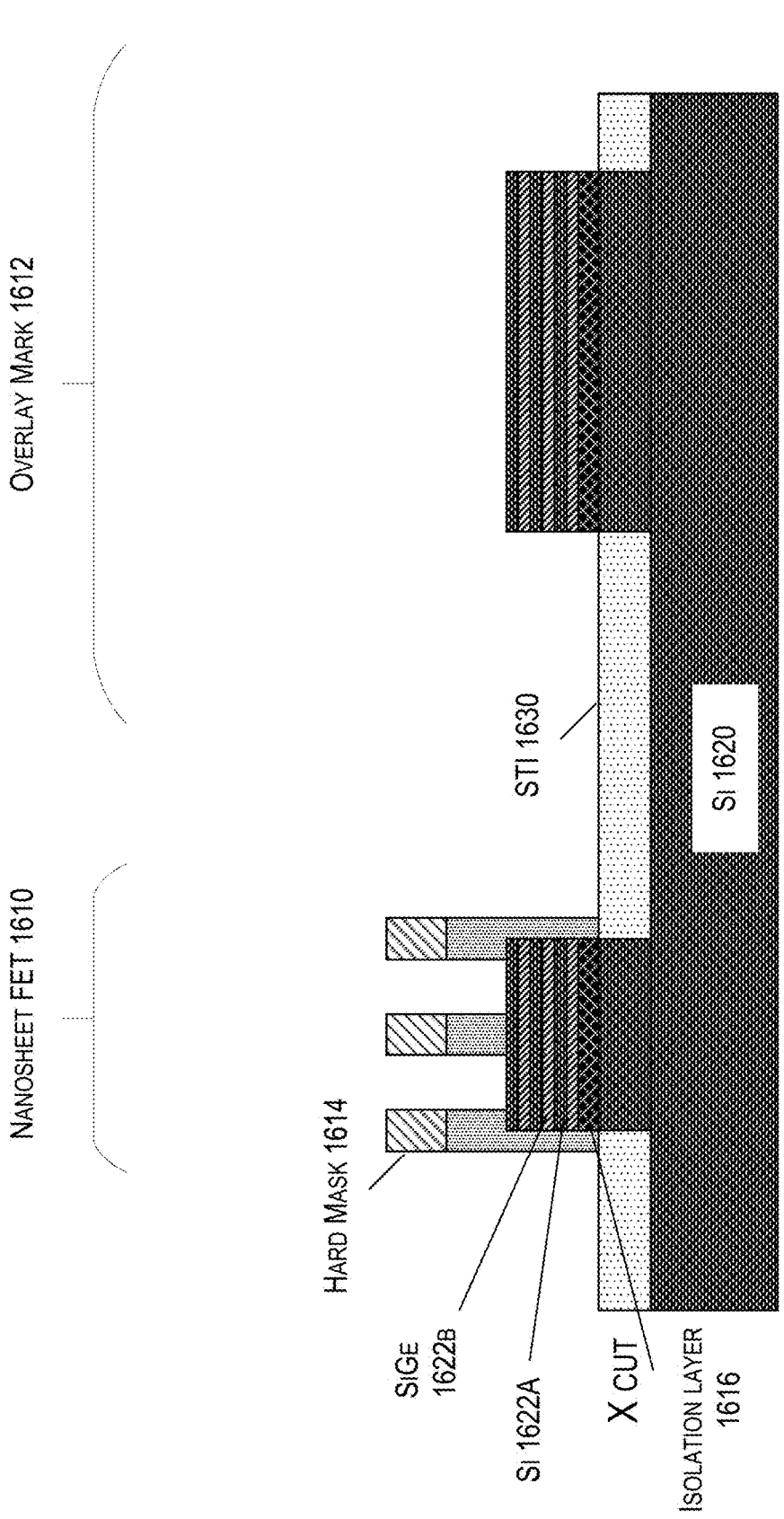
FIGS. 16A-16B illustrate a semiconductor device after the formation of the contact, in accordance with some embodiments.
Figure 16B:
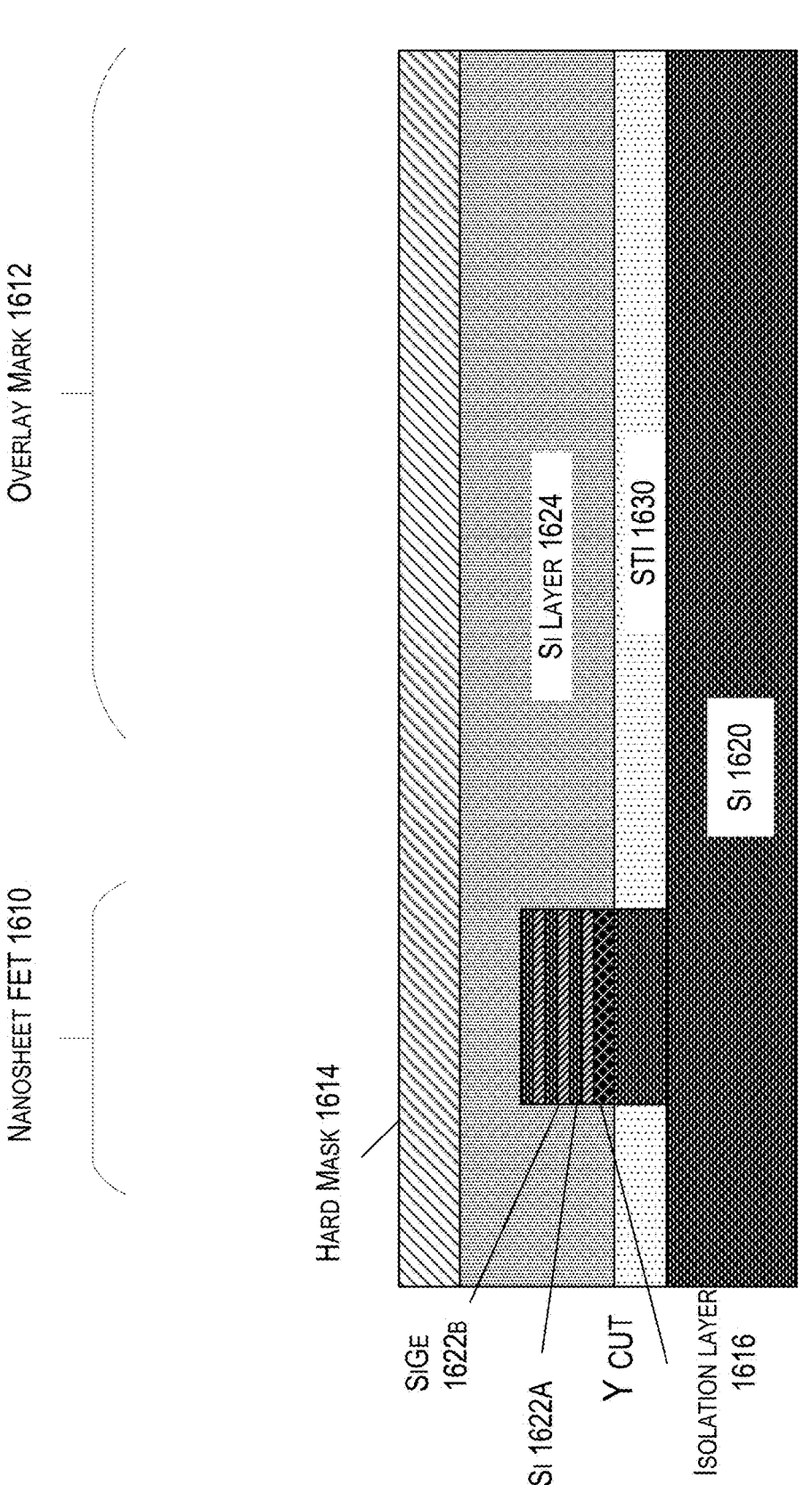

Referring to FIG. 16A now, ax X-section view of the semiconductor device, which includes a nanosheet FET 1610 and an overlay mark 1612, after the dummy gate patterning is shown, consistent with an illustrative embodiment. FIG. 16B illustrates a Y-section view of the semiconductor device. The semiconductor device can include alternating layers of Si 1622A and SiGe 1622B to be used to form the plurality of nanosheets, formed over a substrate 1620. In the illustrative example depicted in FIGS. 16A-16B, the semiconductor device is depicted as being on silicon as a substrate 1620, while it will be understood that other types as substrates may be used as well, including, without limitation, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs), and quaternary (four elements, e.g., aluminum gallium indium phosphide (AlInGaP)) alloys.

In various embodiments, the substrate 1620 may include any suitable material or combination of materials, such as doped or undoped silicon, glass, dielectrics, etc. For example, the substrate may include a silicon-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating film on top.

In various embodiments, an etch stop layer (not shown) is formed over the substrate 1620. The etch stop layer can be a thin layer of material incorporated into the structure of the semiconductor device to provide a selective barrier against etching processes, preventing further removal of underlying materials during fabrication. The etch stop layer can enable precise control over the etching depth and helps define the desired device dimensions. The etch stop layer can further provide a stopping point for the etching process, ensuring that specific layers or regions are not etched beyond a certain point, leading to accurate patterning and control of critical features. The etch stop layer can create a distinct separation between different layers or components within the device structure, and prevent the undesired etching of underlying layers or materials, enabling the creation of complex, multi-layered structures with well-defined interfaces and boundaries. In some embodiments, the etch stop layer acts as a protective barrier for sensitive or delicate materials to shield such materials from aggressive etchants, preventing damage or degradation during subsequent fabrication steps.

In some embodiments, prior to forming the etch stop layer, the substrate 1620 is prepared by cleaning and removing any impurities or oxide layers. The etch stop layer is deposited onto the substrate 1620 using techniques such as chemical vapor deposition (CVD), physical vapor deposition (PVD), or atomic layer deposition (ALD). In an embodiment, a photoresist can be applied, exposed to a patterned mask, developed, and used as a protective layer to define the etch stop regions. The etch stop layer can then be selectively etched, stopping at a predetermined depth, while protecting the underlying layers. After the etching process, the remaining photoresist can be removed through stripping techniques. While in some embodiments, SiGe is used to form the etch stop layer, in some embodiments, silicon nitride (SiN) or silicon oxynitride (SiON) can be used as the etch stop layer.

The alternating layers of Si 1622A and SiGe 1622B can be heavily doped with donor impurities such as phosphorus or arsenic to provide an excess of electrons in an n-type semiconductor device. Similarly, in some embodiments, the alternating layers of Si 1622A and SiGe 1622B can be heavily doped with acceptor impurities such as boron or gallium.

An isolation layer 1616 can be formed over the substrate 1620. The isolation layer 1616 can include silicon germanium and have a higher concentration of Ge compared to the SiGe layers 1622B. In an embodiment, the Ge content of the isolation layer 1616 is about 55% Ge. The alternating layers of Si 1622A and SiGe 1622B can be deposited using techniques such as thermal oxidation, CVD, PVD.

The STI 1630 can be filled over the nanosheet FET 1610 and the overlay mark 1612. In some embodiments, a chemical mechanical polishing (CMP) is performed on the semiconductor device to polish the surface of the semiconductor device and remove the contaminant. In some embodiments, portions of the STI are removed. The removal process stops at the substrate 1620, thus the alternating layers of Si 1622A and SiGe 1622B, and the isolation layer 1616 are exposed.

In some embodiments, the dummy gate patterning can include forming a hard mask 1614 and a silicon layer 1624. The hard mask 1614 can be a thin layer of material to act as a protective layer and to enable precise pattern transfer to the underlying layers during various fabrication steps and aid in pattern transfer. The hard mask 1614 can act as a template for defining the desired patterns on the underlying layers, and provide a protective layer that withstands subsequent etching or deposition processes, ensuring precise pattern transfer with high fidelity. In various embodiments, the hard mask 1614 resists etchants that are aggressive towards the underlying layers, preventing their undesired removal or damage. In additional embodiments, the hard mask 1614 serves as a barrier between different fabrication steps, allowing compatibility with subsequent processes. In order to form the hard mask 1614, the hard mask material is deposited onto the semiconductor device using techniques such as CVD, PVD, or ALD. Silicon nitride (SiN) and silicon oxide (SiO2) can be used as hard masks.

Figure 17A:
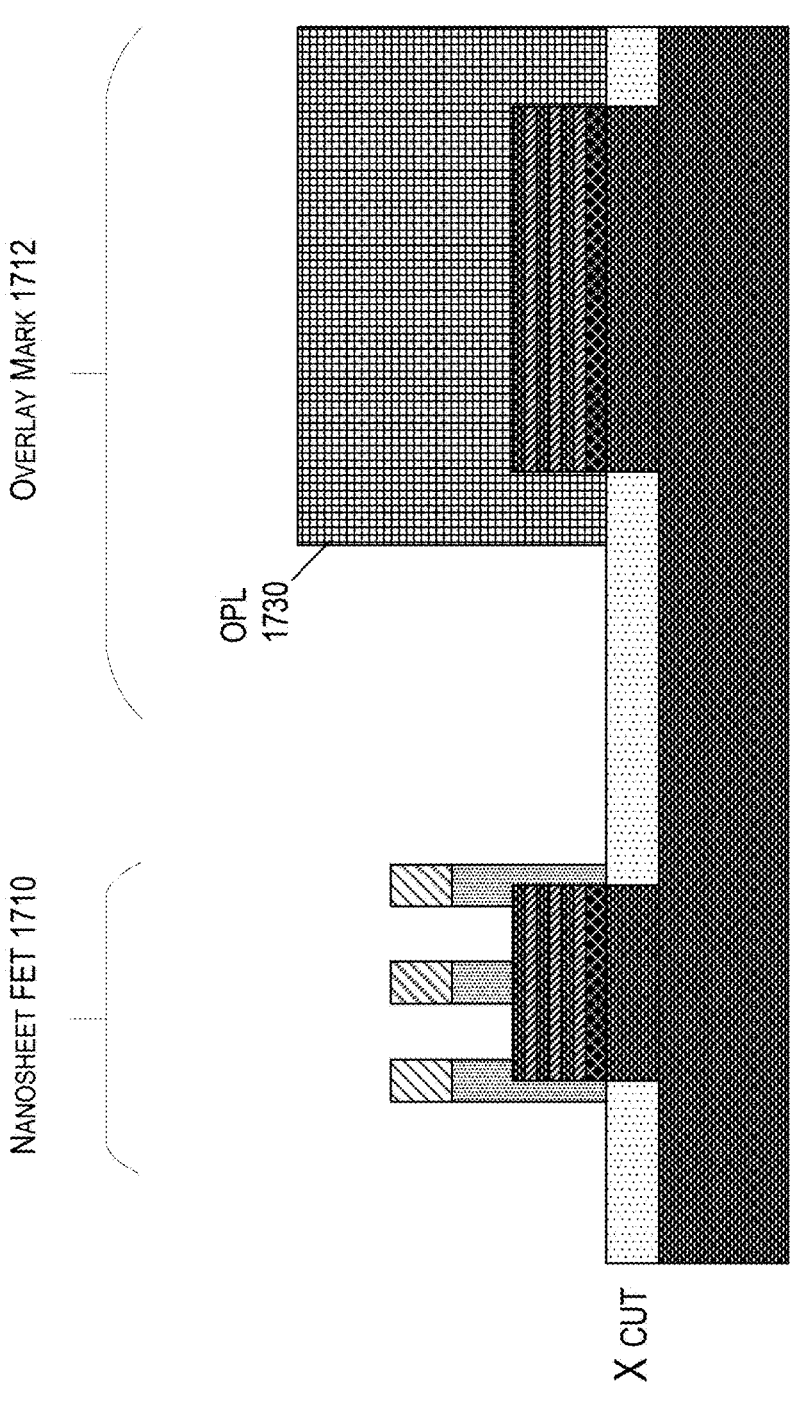
FIGS. 17A-17B illustrate a semiconductor device after the patterning of the dummy gate, in accordance with some embodiments.
Figure 17B:
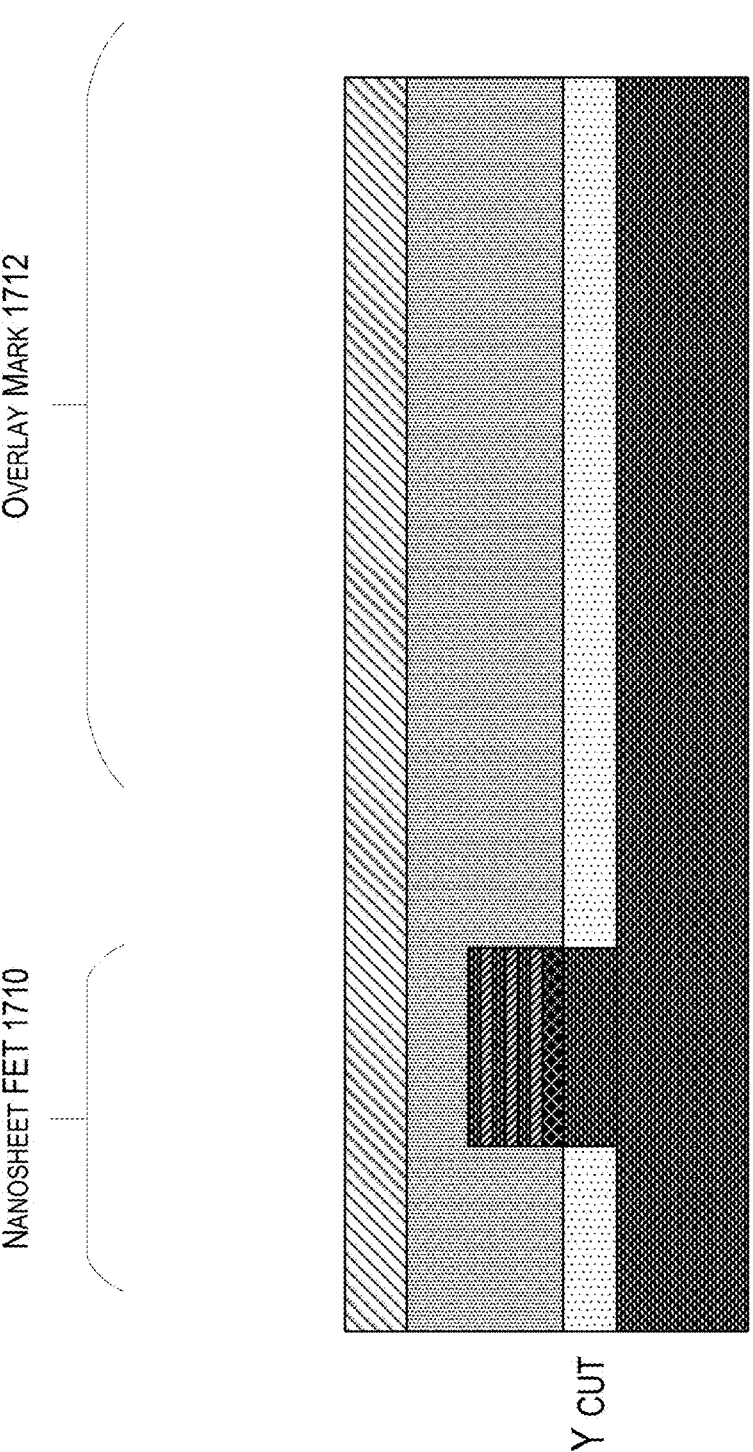

FIG. 17A illustrates an X-section view of the semiconductor device, which includes a nanosheet FET 1710 and an overlay mark 1712, after a lithography, in accordance with some embodiments. FIG. 17B illustrates a Y-section view of the semiconductor device. In some embodiments, an OPL 1730 is formed over the overlay mark 1712. The OPL 1730 can include a photo-sensitive organic polymer having a light-sensitive material that, when exposed to electromagnetic radiation, is chemically altered and thus configured to be removed using a developing solvent. For example, in some embodiments, the photo-sensitive organic polymer can be polyacrylate resin, epoxy resin, phenol resin, polyamide resin, polyimide resin, unsaturated polyester resin, polyphenylene ether resin, polyphenylene sulfide resin, or benzocyclobutene (BCB). In some embodiments, the OPL 1730 can include any organic polymer and a photoactive compound having a molecular structure that can attach to the molecular structure of the organic polymer. In some embodiments, the OPL 1730 material is selected to be compatible with an overlying antireflective coating (not shown) and/or an overlying photoresist (not shown). In some embodiments, the OPL 1730 can be applied using spin coating technology, although other techniques are within the contemplated scope of the present disclosure.

Figure 18A:
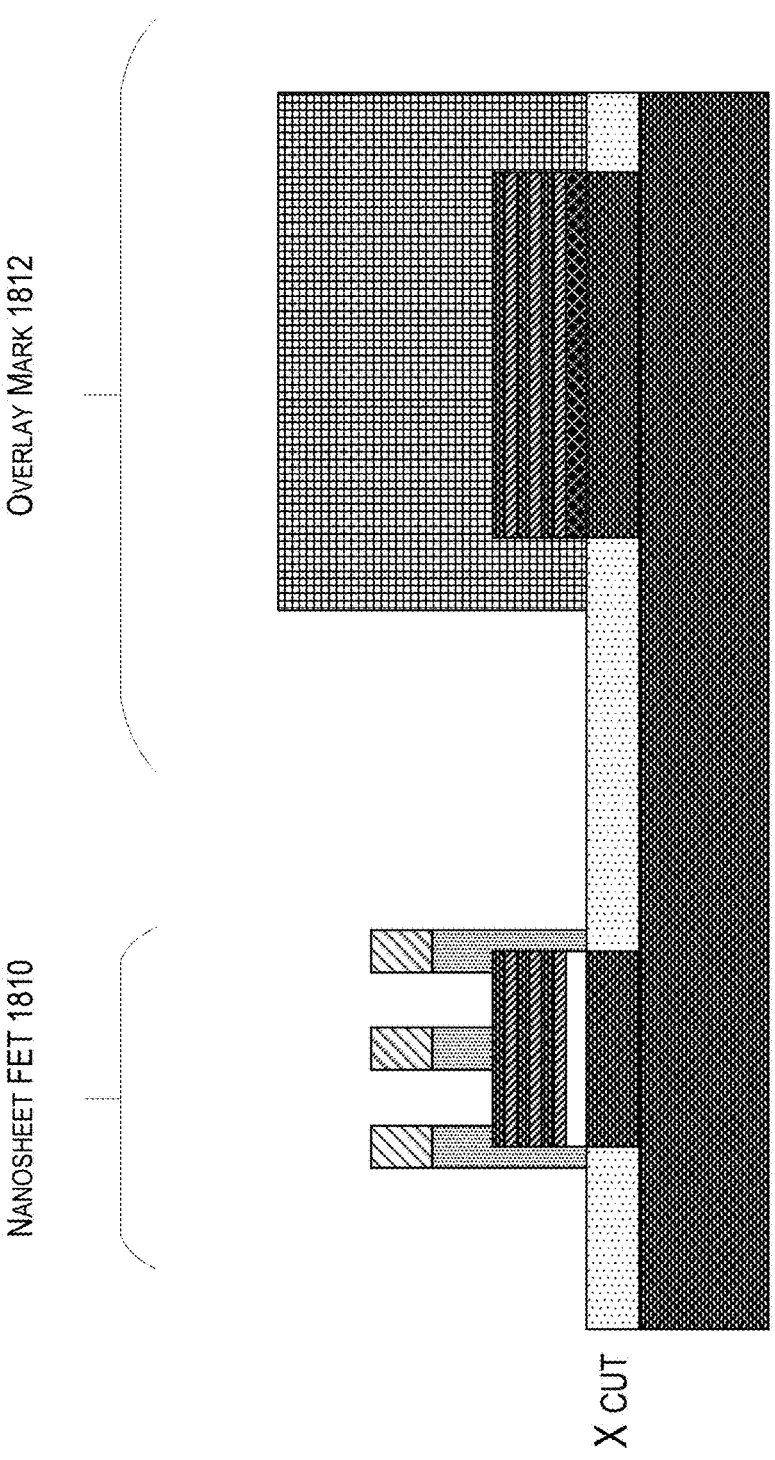
FIGS. 18A-18B illustrate a semiconductor device after the lithography, in accordance with some embodiments.
Figure 18B:
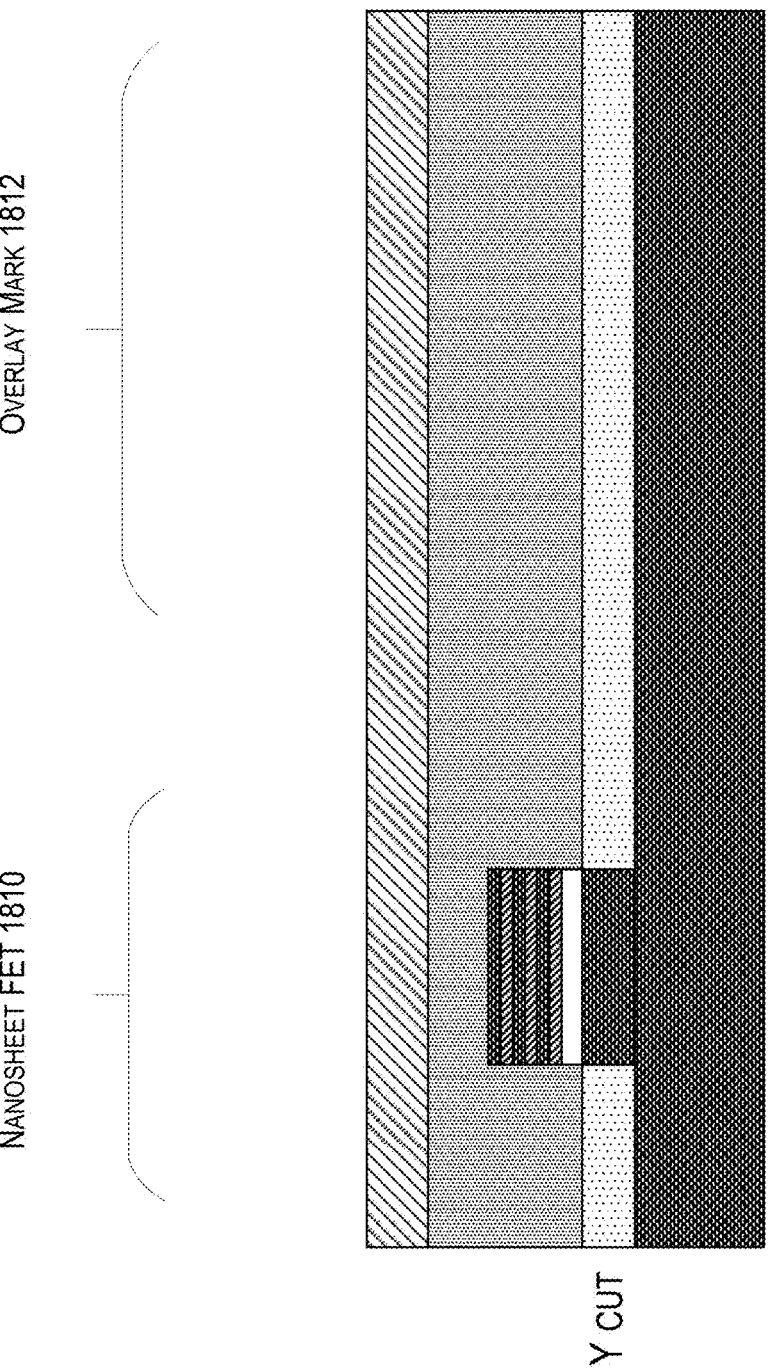

FIG. 18A illustrates an X-section view of the semiconductor device, which includes a nanosheet FET 1810 and an overlay mark 1812, after the removal of the isolation layer, in accordance with some embodiments. In some embodiments, the isolation layer is removed from the top surface of the substrate in the nanosheet FET 1810. It should be noted that, since the OPL is formed over the overlay mark 1812, the overlay mark 1812 remains intact. FIG. 18B illustrates a Y-section view of the semiconductor device.

Figure 19A:
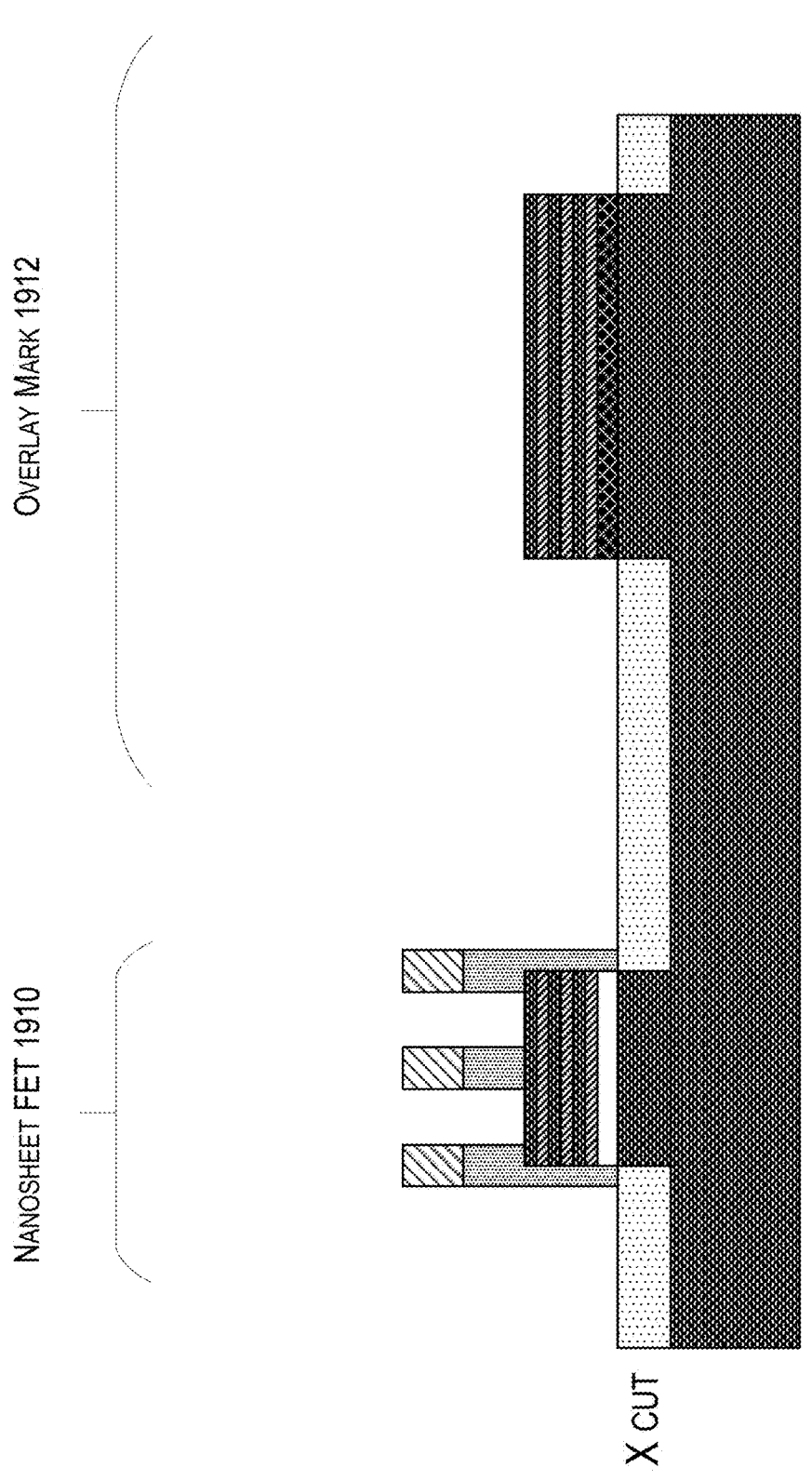
FIGS. 19A-19B illustrate a semiconductor device after the removal of the isolation layer, in accordance with some embodiments.
Figure 19B:
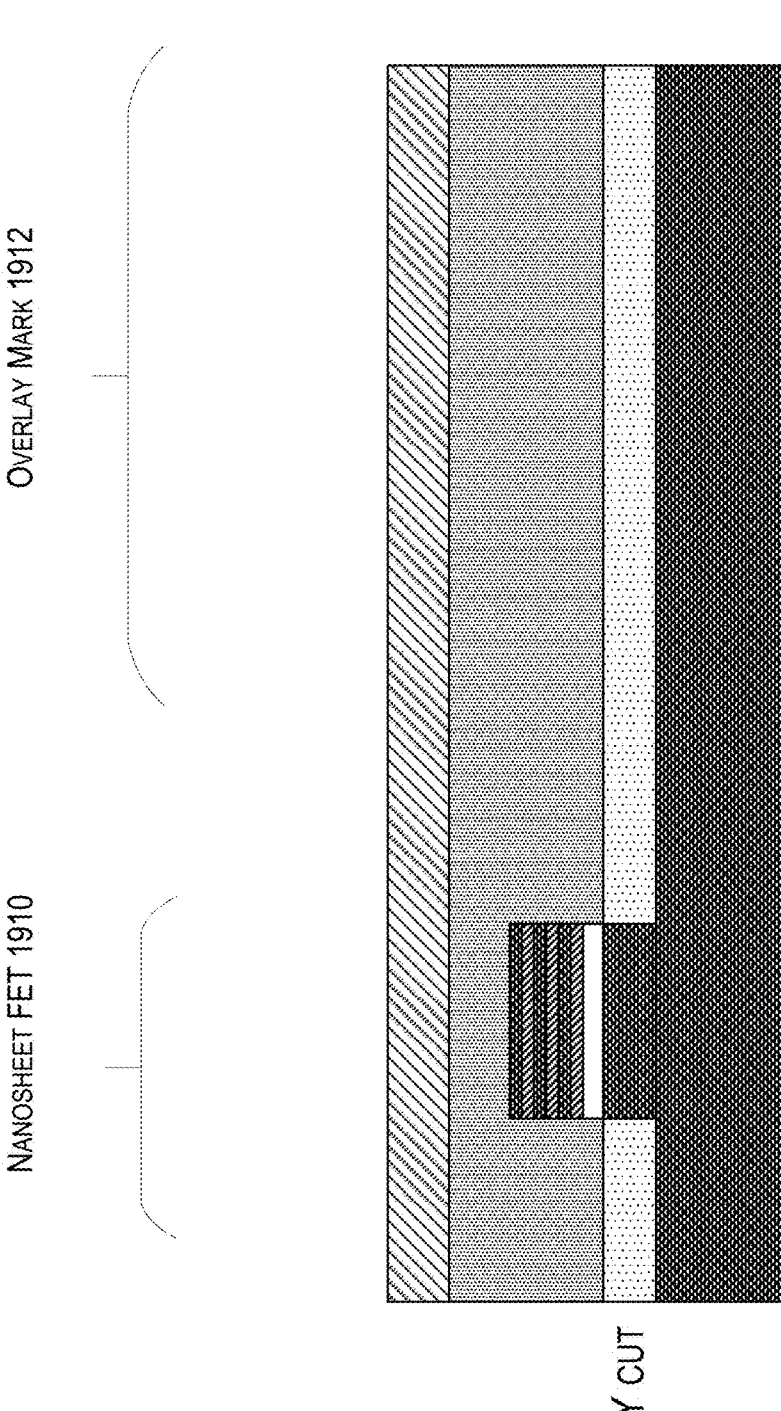

FIG. 19A illustrates an X-section view of the semiconductor device, which includes a nanosheet FET 1910 and an overlay mark 1912, after the removal of the OPL, in accordance with some embodiments. In order to perform the next acts in fabricating the semiconductor device, the OPL is removed from the overlay mark 1912. FIG. 19B illustrates a Y-section view of the semiconductor device.

Figure 20A:
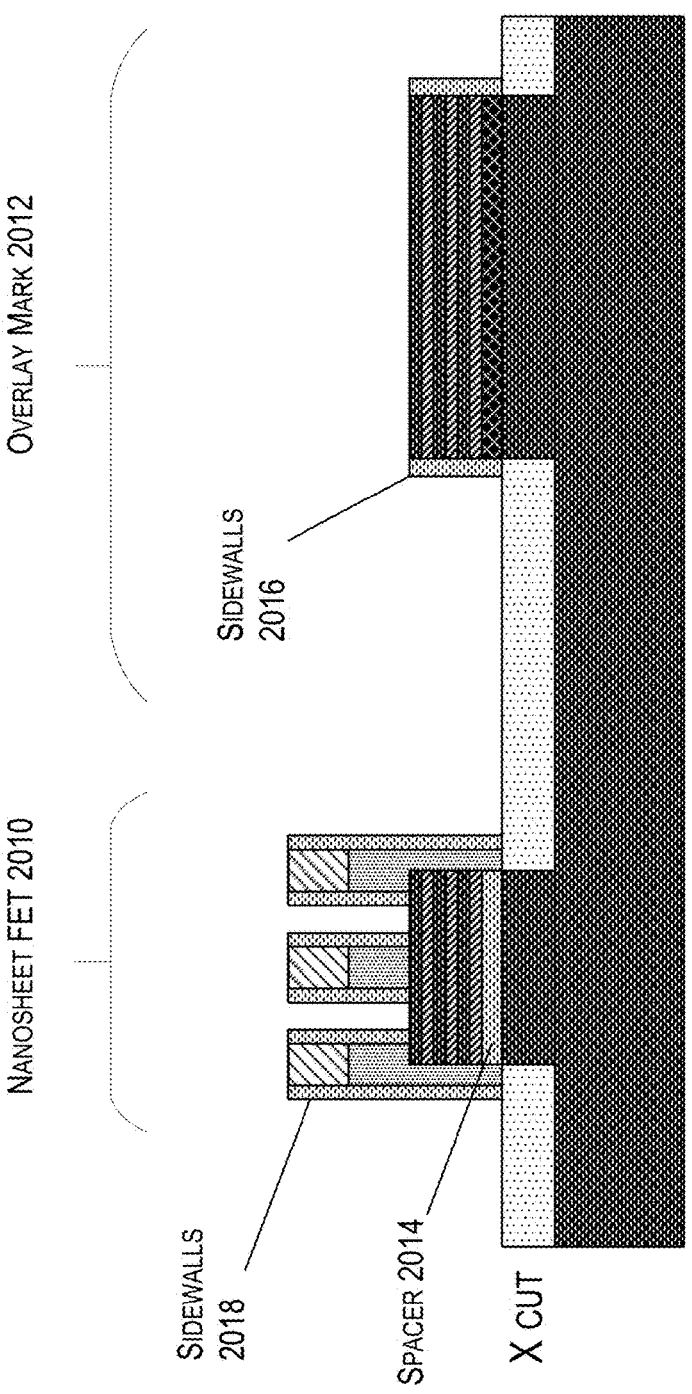
FIGS. 20A-20B illustrate a semiconductor device after the removal of the OPL, in accordance with some embodiments.
Figure 20B:
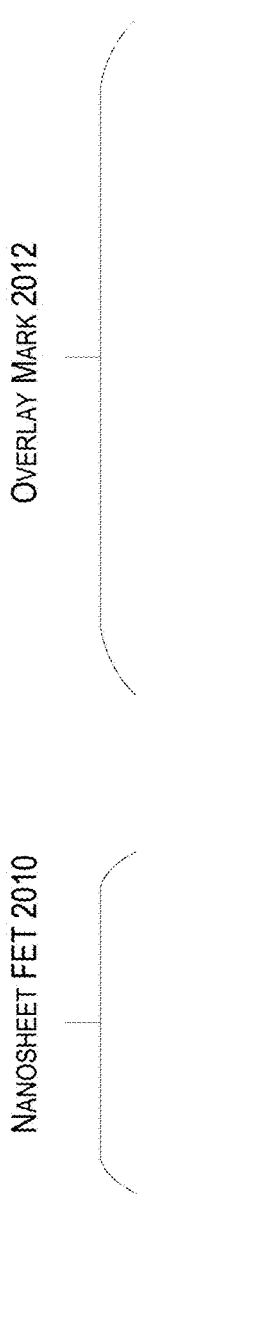
Figure 20B:
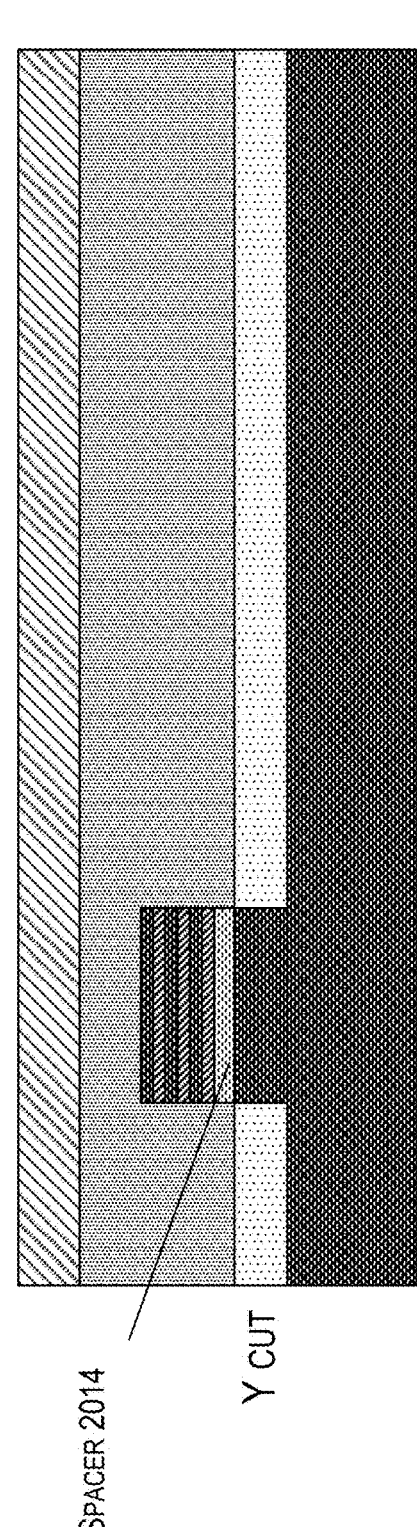

FIG. 20A illustrates an X-section view of the semiconductor device, which includes a nanosheet FET 2010 and an overlay mark 2012, after the spacer formation, in accordance with some embodiments. FIG. 20B illustrates a Y-section view of the semiconductor device. In some embodiments, the spacer 2014 is formed over the sidewalls 2016 of the middle section of the overlay mark 2012 and the sidewalls 2018 of the dummy gates over the nanosheet FET 2010. Further, the spacer 2014 is formed over the substrate in the nanosheet FET 2010. It should be noted that, since the isolation layer remained intact in the overlay mark 2012, the spacer 2014 is not formed over the substrate in the overlay mark 2012.

In some embodiments, the spacer 2014 is formed over the alternating layers of Si and SiGe. The spacer 2014 can be a thin insulating layer or material that helps control the effective channel length of the semiconductor device. In various embodiments, the spacer 2014 can allow for control over the channel's conductive properties, including resistance and carrier mobility, which can contribute to improved performance of the semiconductor device.

In some embodiments, the spacer 2014 can act as insulating layers between the gate regions and the source/drain regions. That is, the spacer 2014 can help prevent current leakage or short circuits between the gate regions and the source/drain regions. Such isolation can help maintain the integrity of the semiconductor device's electrical operation and prevent unintended current flow that could negatively impact the performance of the semiconductor device and reliability.

In further embodiments, the spacer 2014 can be utilized to modulate the overlapping capacitance between the gate regions and the source/drain regions. Overlapping capacitance can affect the semiconductor device's electrical characteristics, such as threshold voltage and switching behavior. Thus, by adjusting the thickness and material properties of the spacer 2014, the overlapping capacitance can be optimized, which can allow for better control and modulation of the semiconductor device's behavior.

In several embodiments, the spacer 2014 can help mitigate the short-channel effects by physically separating the gate regions from the source/drain regions. To that end, the spacer 2014 can create a barrier that restricts the extension of the electric field into the channel region, reducing the impact of drain-induced barrier lowering and subthreshold leakage. This mitigation can improve the semiconductor device's performance, reduce power consumption, and enhance overall device reliability.

In an embodiment, the spacer 2014 can serve as barriers that prevent the lateral diffusion of dopant atoms from the source/drain regions into the channel region during the doping process. Such diffusion can alter the channel characteristics and compromise the semiconductor device's performance. By confining the dopant diffusion, the spacer 2014 can contribute to maintaining the desired semiconductor device's characteristics and electrical behavior. The spacer can be made of silicon nitride.

Figure 21A:
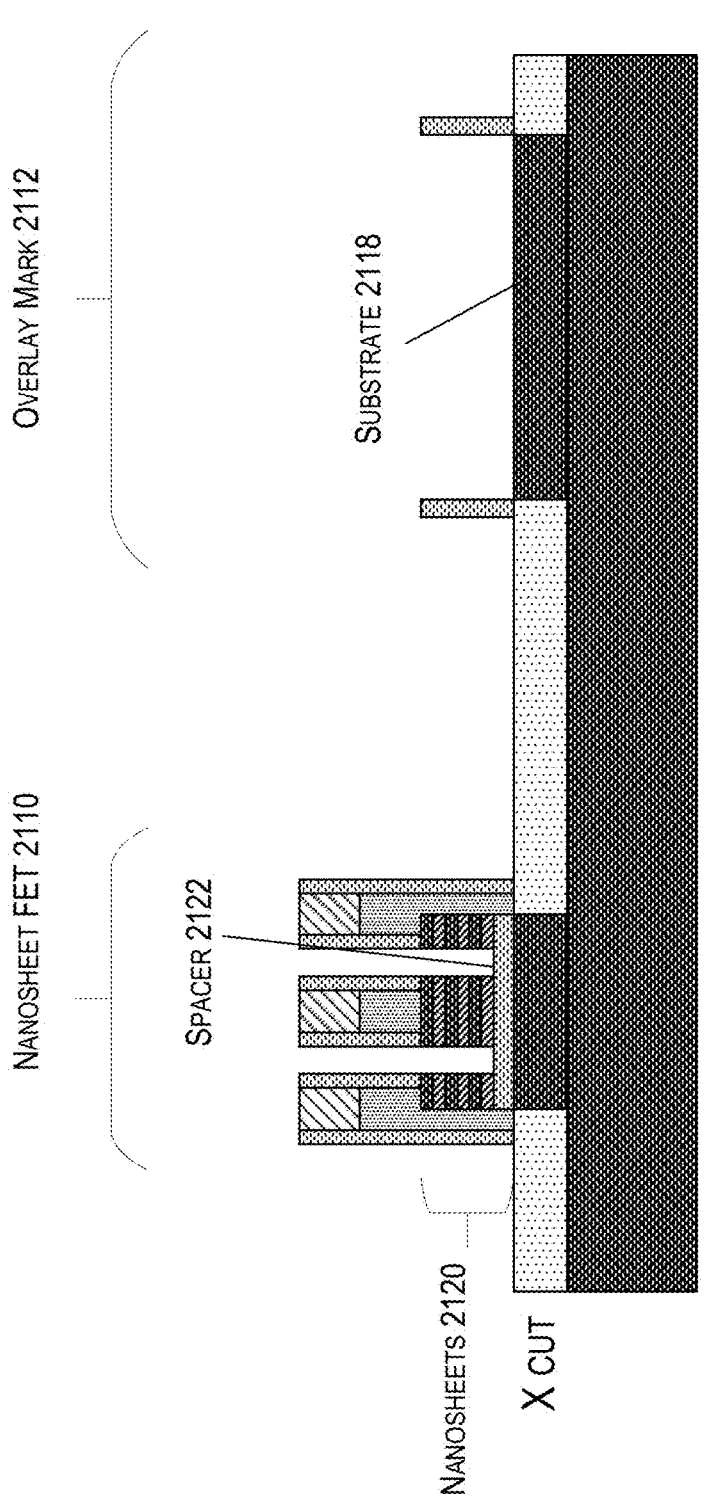
FIGS. 21A-21B illustrate a semiconductor device after the spacer formation, in accordance with some embodiments.
Figure 21B:
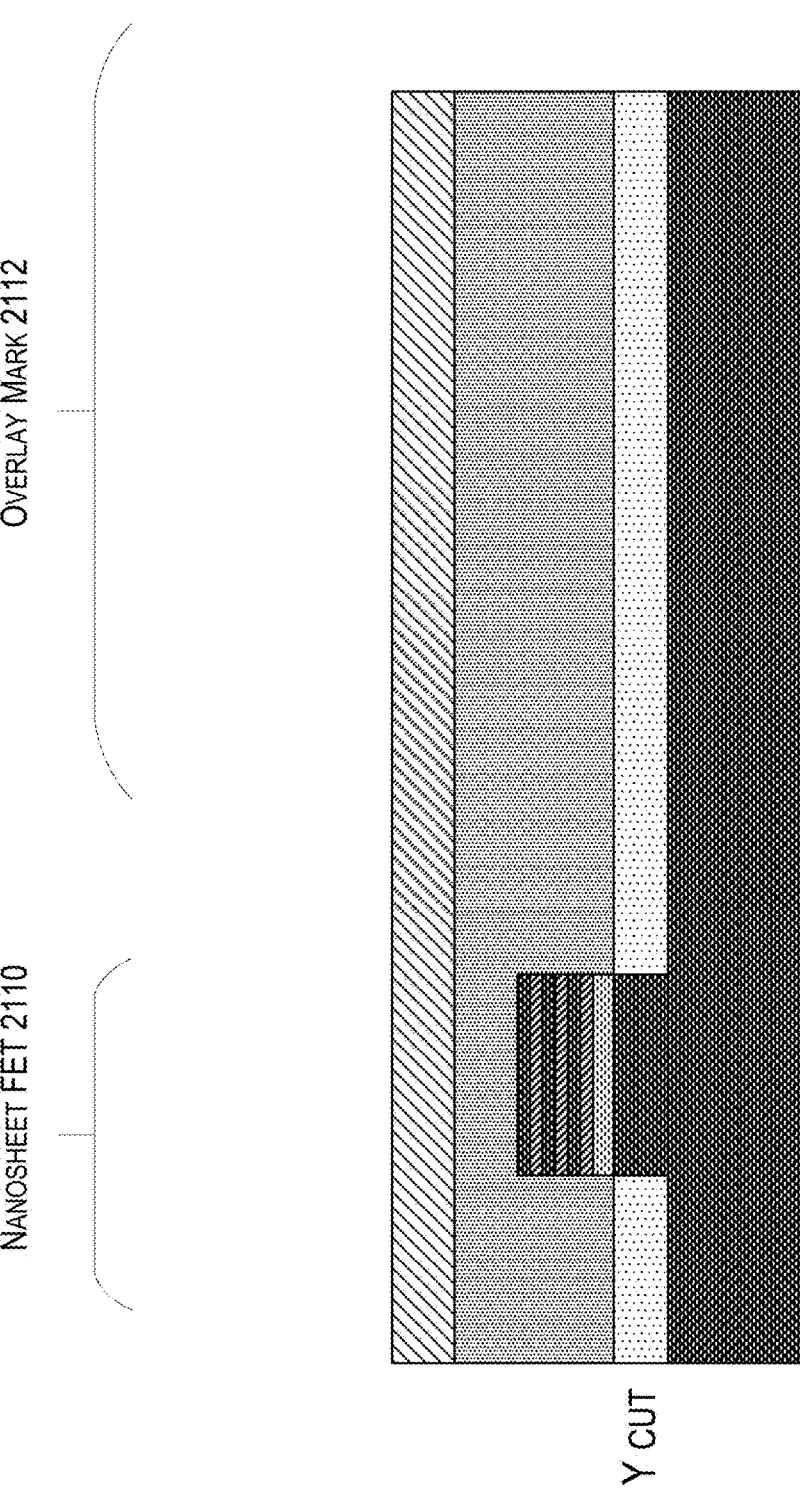

FIG. 21A illustrates an X-section view of the semiconductor device, which includes a nanosheet FET 2110 and an overlay mark 2112, after the nanosheet 2120 formation, in accordance with some embodiments. FIG. 21B illustrates a Y-section view of the semiconductor device. In some embodiments, portions of the alternating layers of Si and SiGe are removed to expose the spacer 2122 in the nanosheet FET 2110, to form the nanosheet 2120. The portions of the alternating layers of Si and SiGe can be removed by an etching process. The etching process can stop at the spacer 2122 in the nanosheet FET 2110. Further, the alternating layers of Si and SiGe over the substrate 2118, along with the isolation layer, are removed in the overlay mark 2112, thus, exposing the substrate 2118.

Figure 22A:
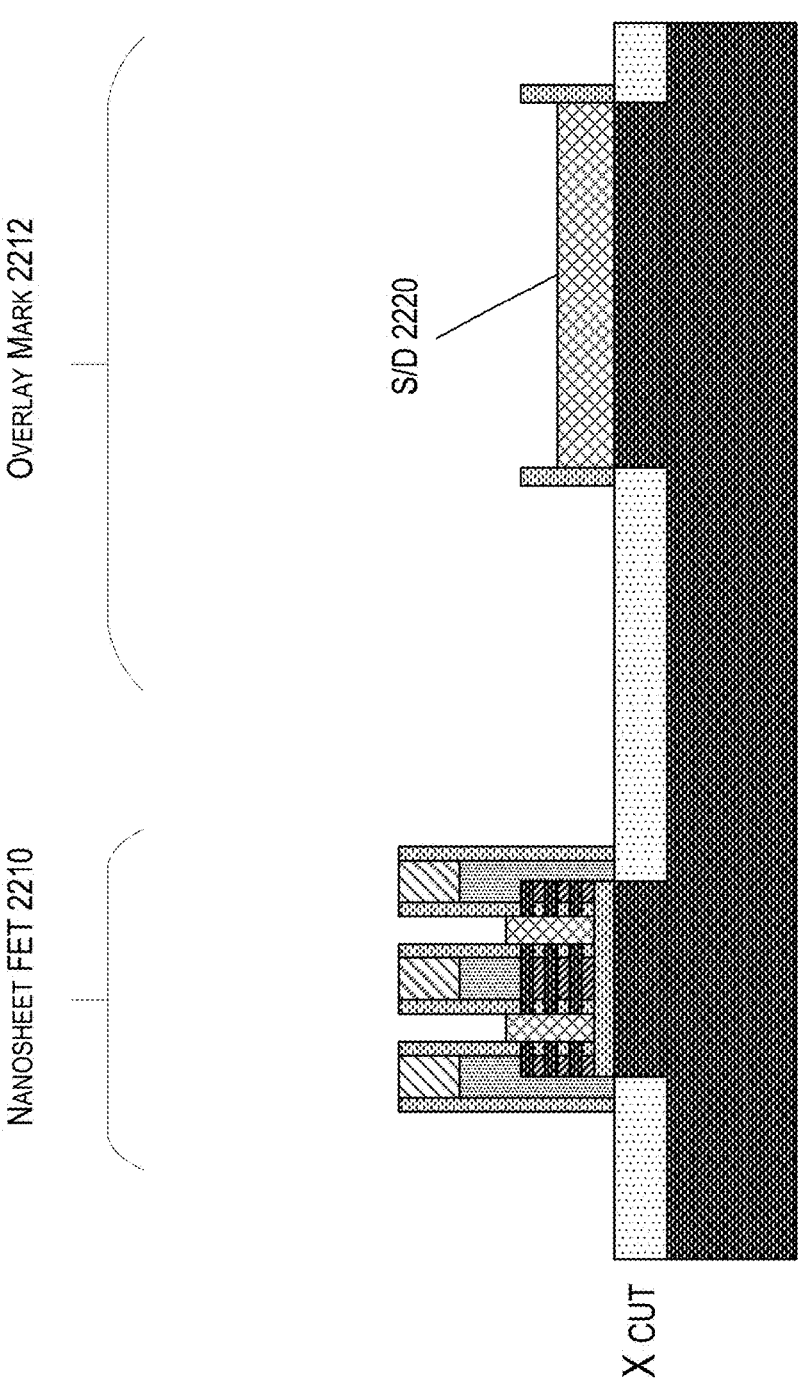
FIGS. 22A-22B illustrate a semiconductor device after the nanosheet formation, in accordance with some embodiments.
Figure 22B:
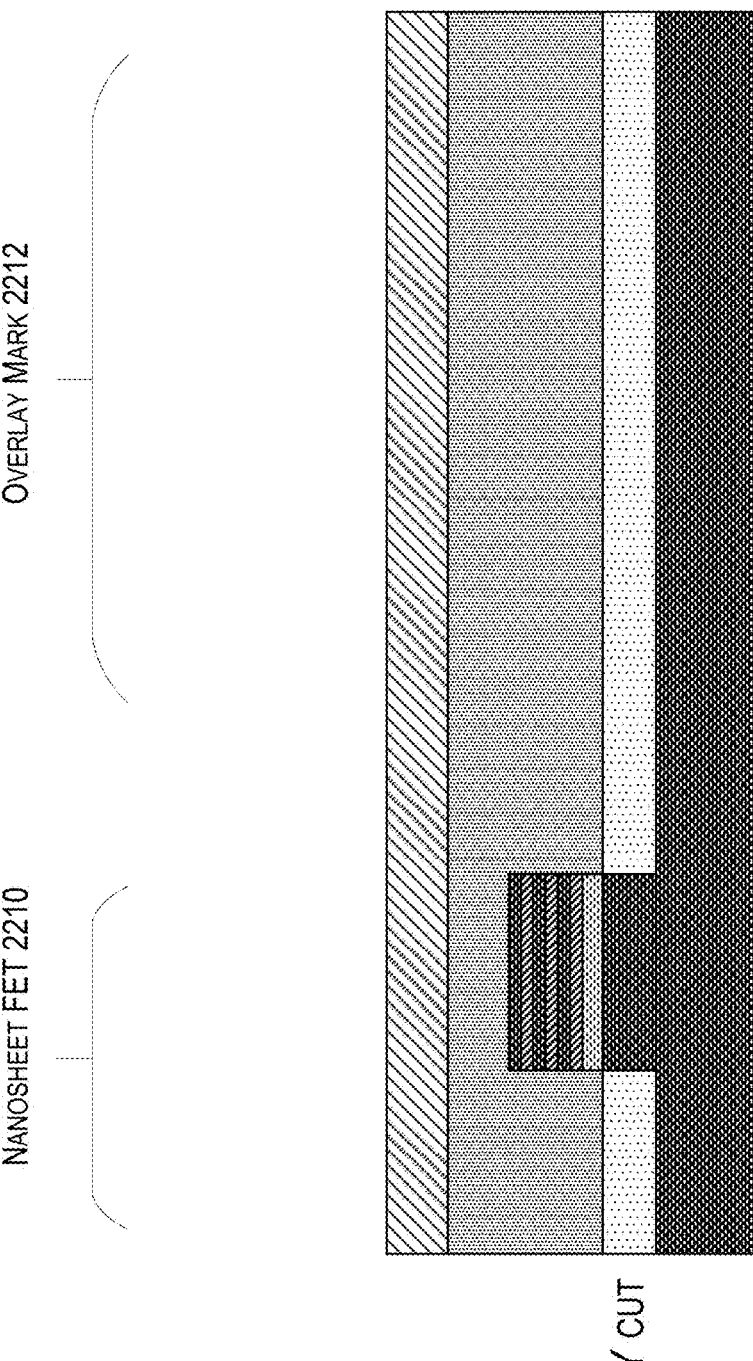

FIG. 22A illustrates an X-section view of the semiconductor device, which includes a nanosheet FET 2210 and an overlay mark 2212, after the source/drain region formation, in accordance with some embodiments. FIG. 22B illustrates a Y-section view of the semiconductor device. For example, the source/drain region 2220 is formed between the nanosheets and over the spacers in the nanosheet FET 2210 and over the substrate in the overlay mark 2212. The source/drain region 2220 can be made of silicon or silicon germanium.

Figure 23A:
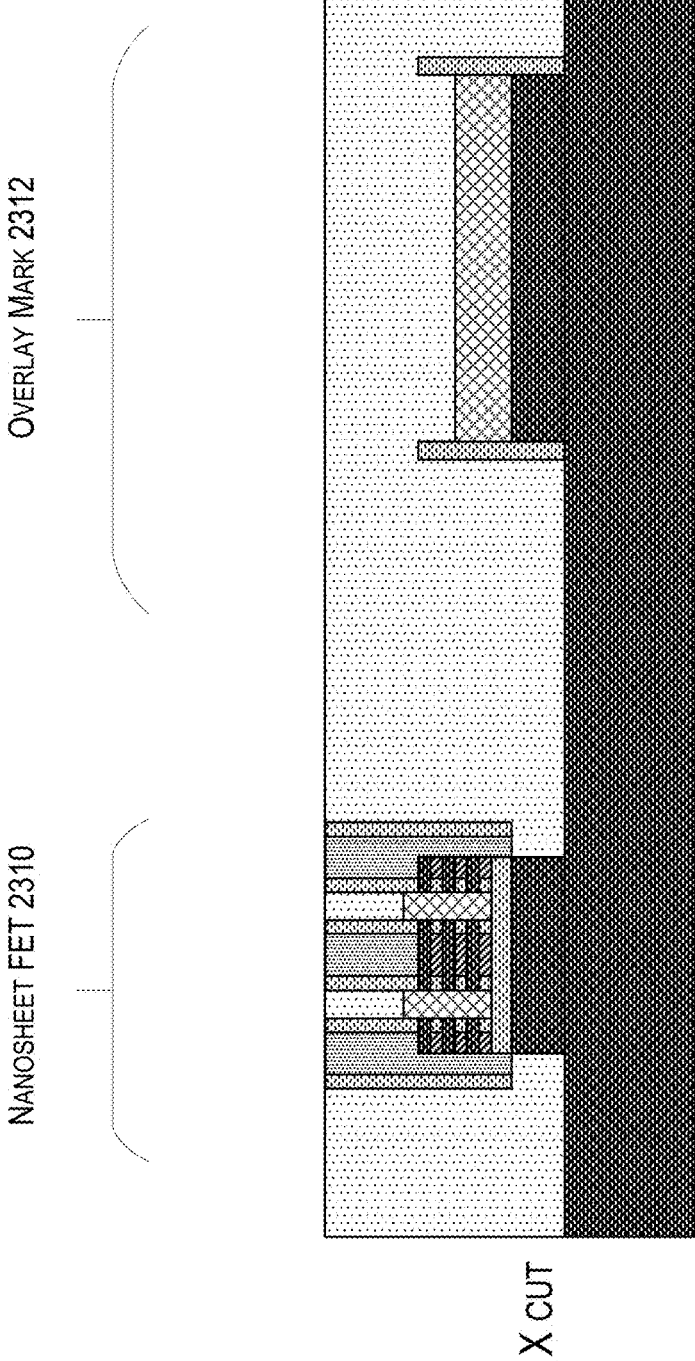
FIGS. 23A-23B illustrate a semiconductor device after the source/drain region formation, in accordance with some embodiments.
Figure 23B:
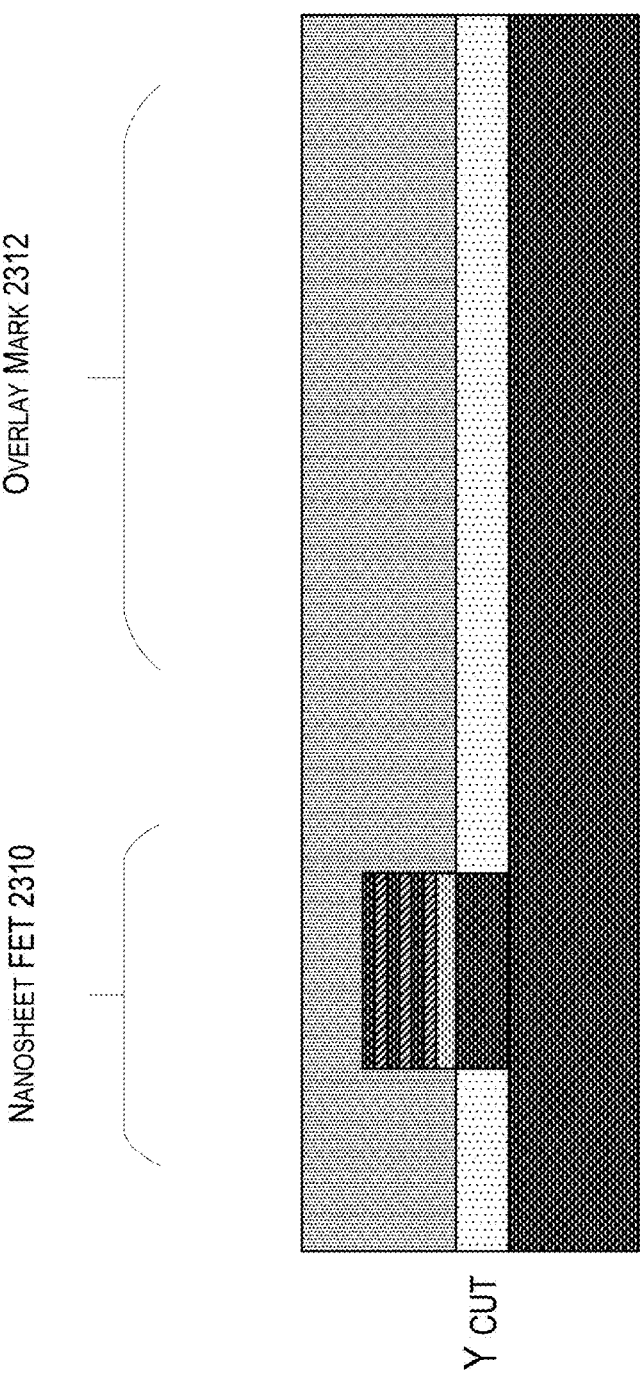

FIG. 23A illustrates an X-section view of the semiconductor device, which includes a nanosheet FET 2310 and an overlay mark 2312, after additional STI formation, in accordance with some embodiments. FIG. 23B illustrates a Y-section view of the semiconductor device. For example, additional STI is formed over the semiconductor device to encapsulate the nanosheet FET2310 and the overlay mark 2312. STI can be a layer of insulating material to electrically isolate and provide mechanical support between different layers of conducting and active components. STI can enable efficient signal transmission, reduce crosstalk, and ensure the proper functioning of the semiconductor device. STI can electrically isolate adjacent conducting layers or active components in the semiconductor device. By providing insulation between different layers, STI prevents electrical shorts, minimizes leakage current, and ensures that signals are directed only along the desired pathways. In some embodiments, STI can help reduce parasitic capacitance between adjacent metal interconnects or active devices and provide mechanical support to the integrated circuit structure.

STI can be deposited onto the substrate using various techniques such as CVD, spin-on deposition, plasma-enhanced CVD (PECVD), or ALD. In some embodiments, after deposition, planarization techniques are employed to ensure a flat and smooth surface. In an embodiment, chemical mechanical polishing (CMP) can be used to remove excess material and achieve a uniform surface topography. In some embodiments, silicon dioxide (SiO2), or a low-k dielectric, e.g., organosilicates, fluorinated silicates, or porous materials, can be used as STI. Alternatively, polymer-based materials, such as polyimide or polybenzoxazole (PBO), can be used as STI.

Figure 24A:
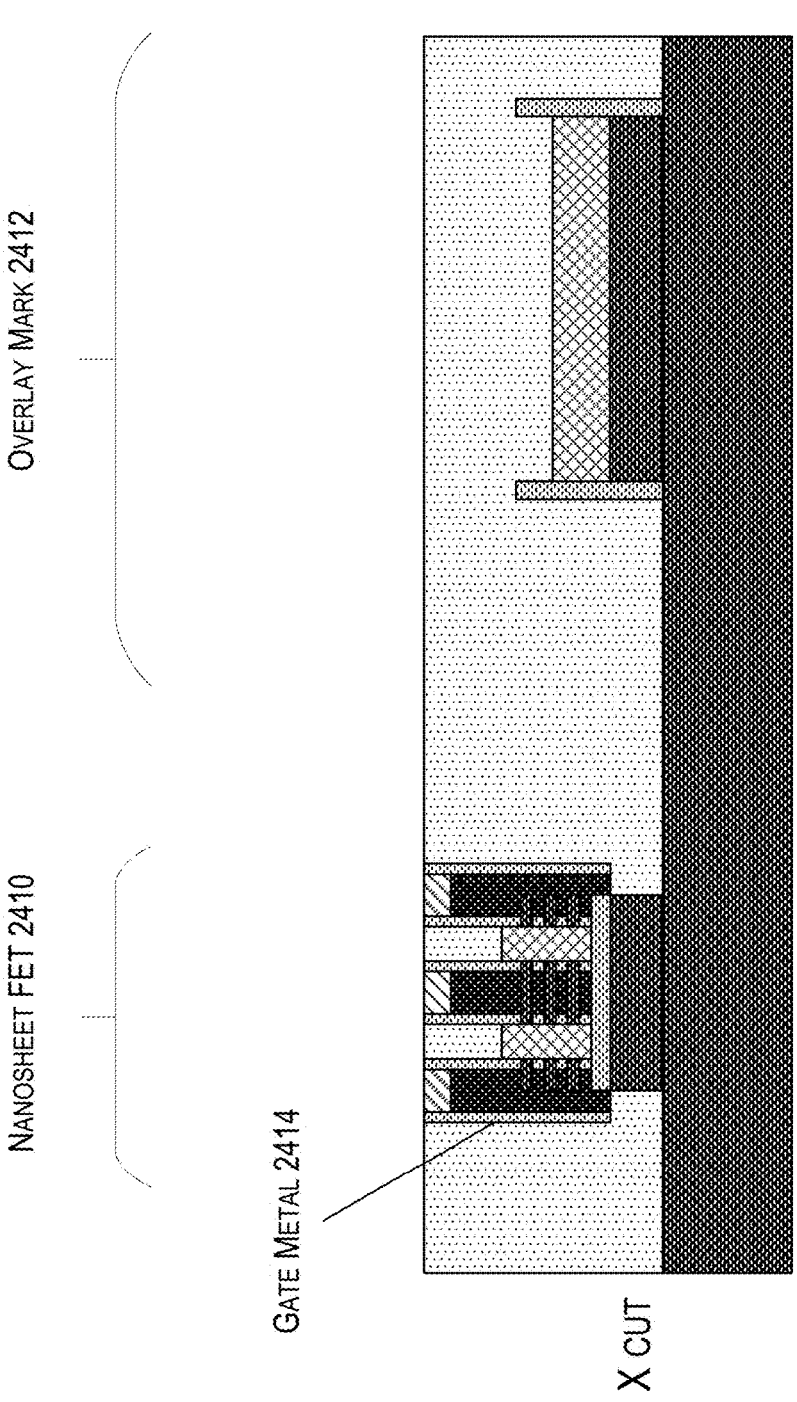
FIGS. 24A-24B illustrate a semiconductor device after additional STI formation, in accordance with some embodiments.
Figure 24B:
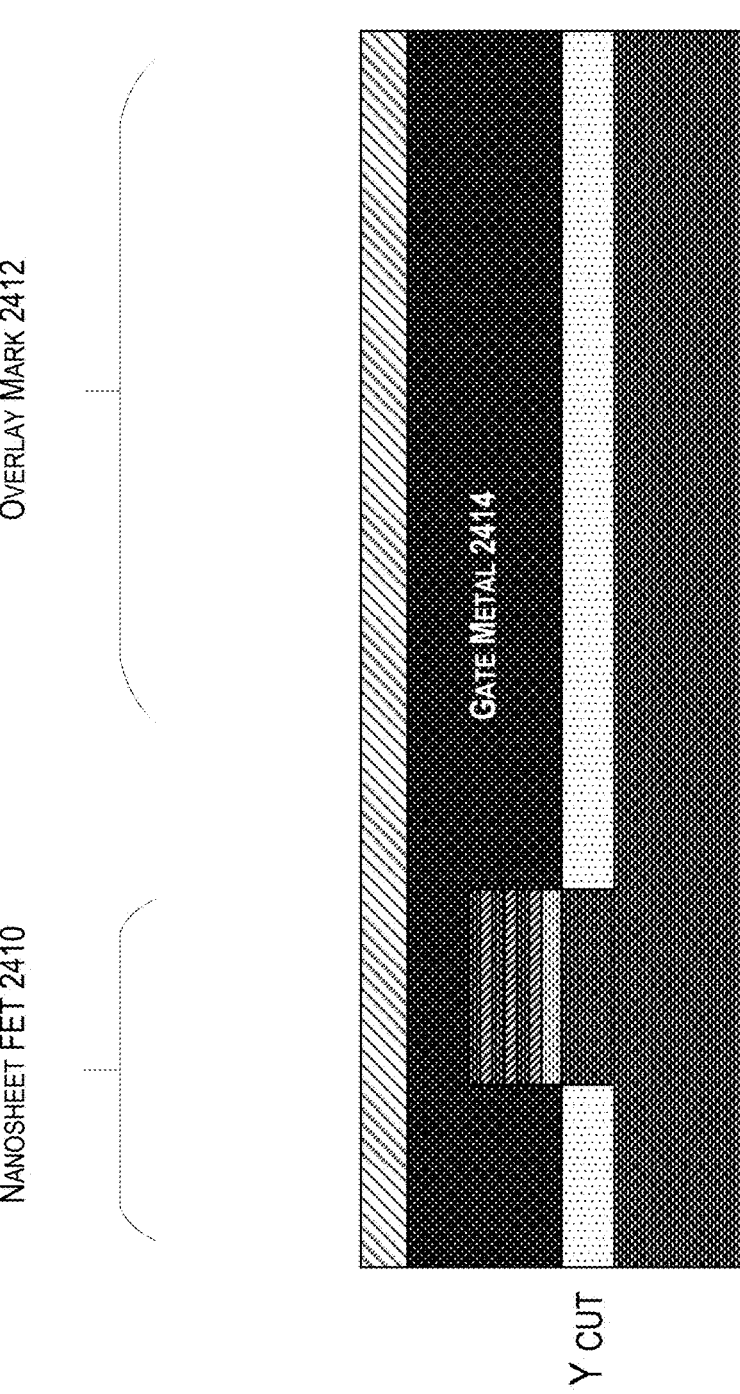

FIG. 24A illustrates an X-section view of the semiconductor device, which includes a nanosheet FET 2410 and an overlay mark 2412, after gate metal formation, in accordance with some embodiments. FIG. 24B illustrates a Y-section view of the semiconductor device. For example, the dummy gate is removed and the gate metal 2414 is formed. The gate metal can be an electrically conductive metal added to control current flow in field-effect transistors as the primary on/off switch. The metal gate can include a doped polysilicon film directly formed on the thin gate dielectric. The metal gate can include metals such as tungsten or tantalum.

Figure 25A:
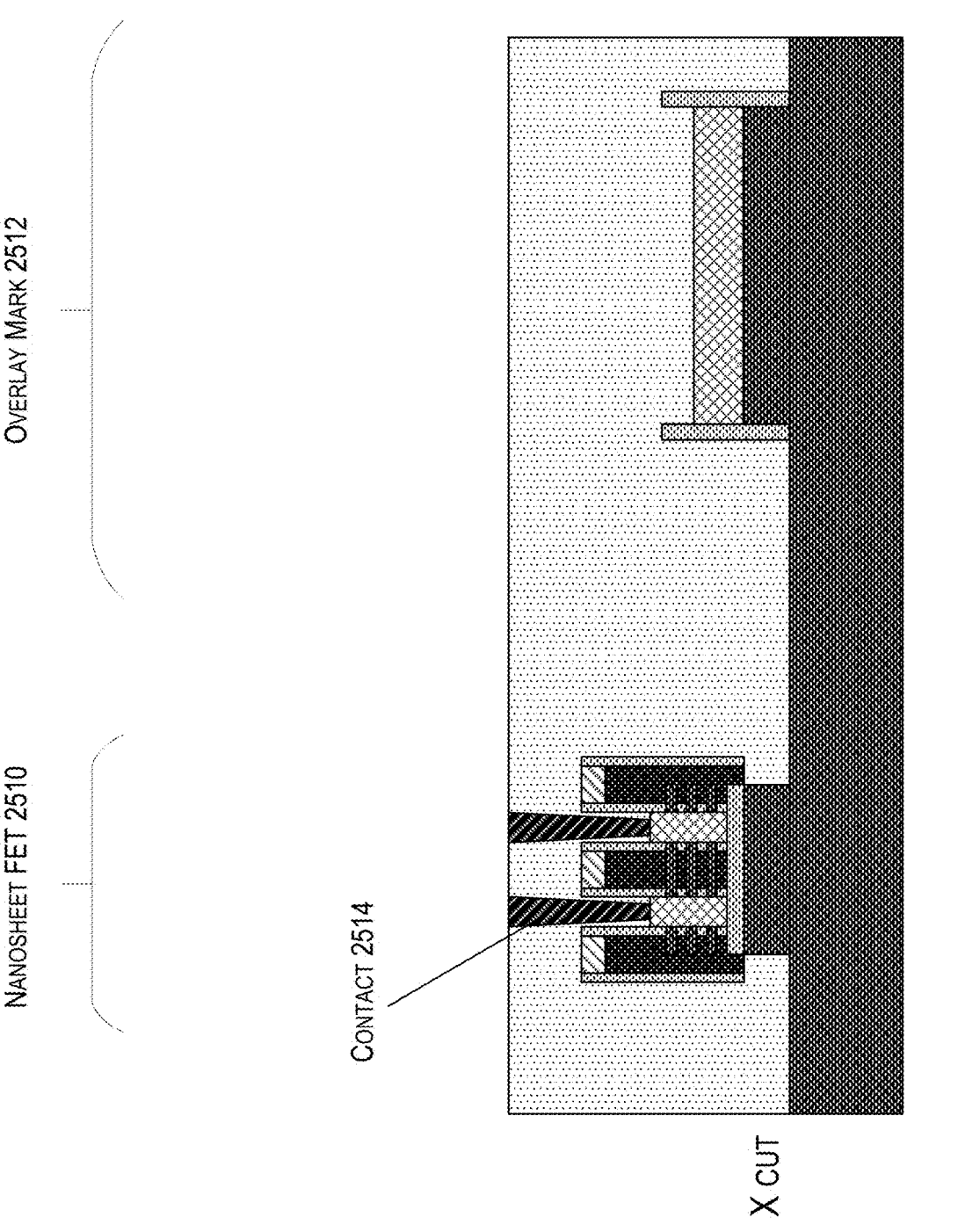
FIGS. 25A-25B illustrate a semiconductor device after gate metal formation, in accordance with some embodiments.
Figure 25B:
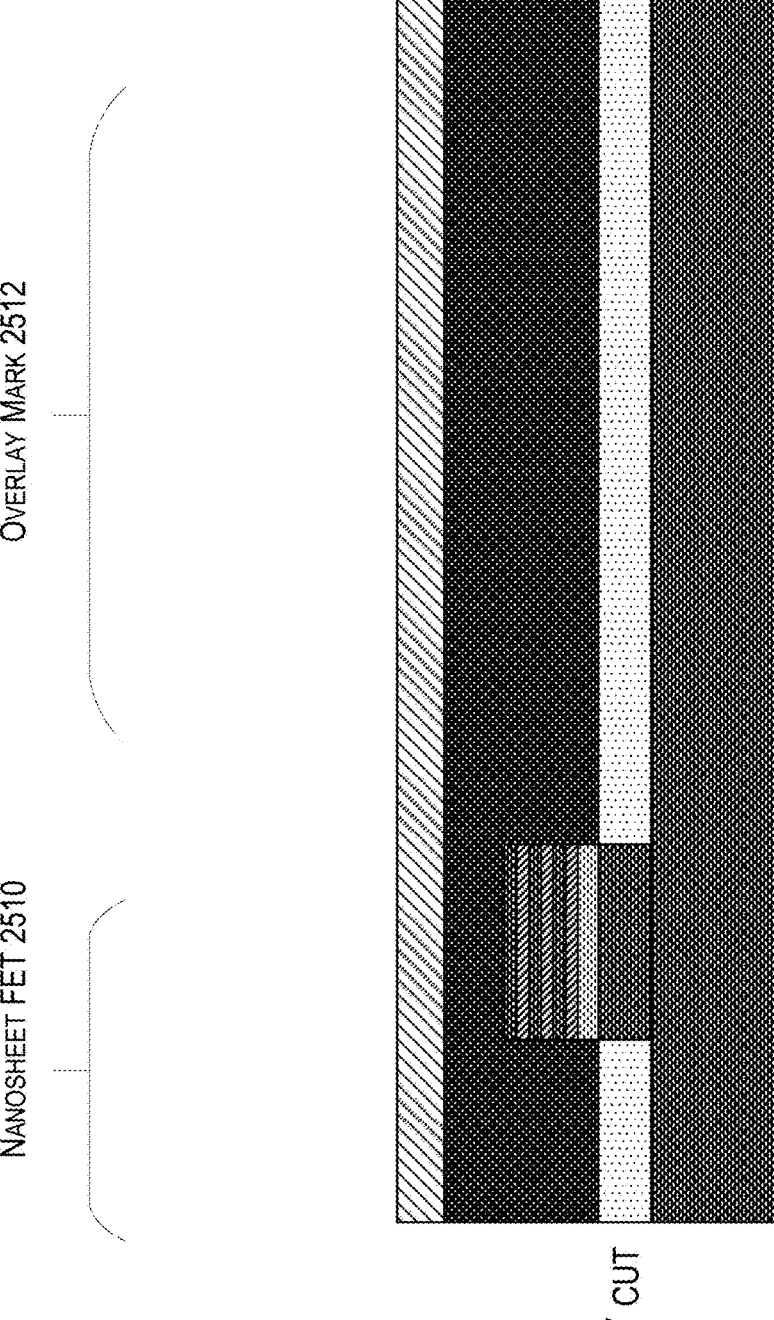

FIG. 25A illustrates an X-section view of the semiconductor device, which includes a nanosheet FET 2510 and an overlay mark 2512, after contact formation, in accordance with some embodiments. FIG. 25B illustrates a Y-section view of the semiconductor device. For example, the contacts 2514 are formed to connect the source/drain regions within the semiconductor and/or to other components on other semiconductor devices. In an embodiment, additional dielectric is deposited to encapsulate the nanosheet FET 2510 and the overlay mark 2512.

Figure 26:
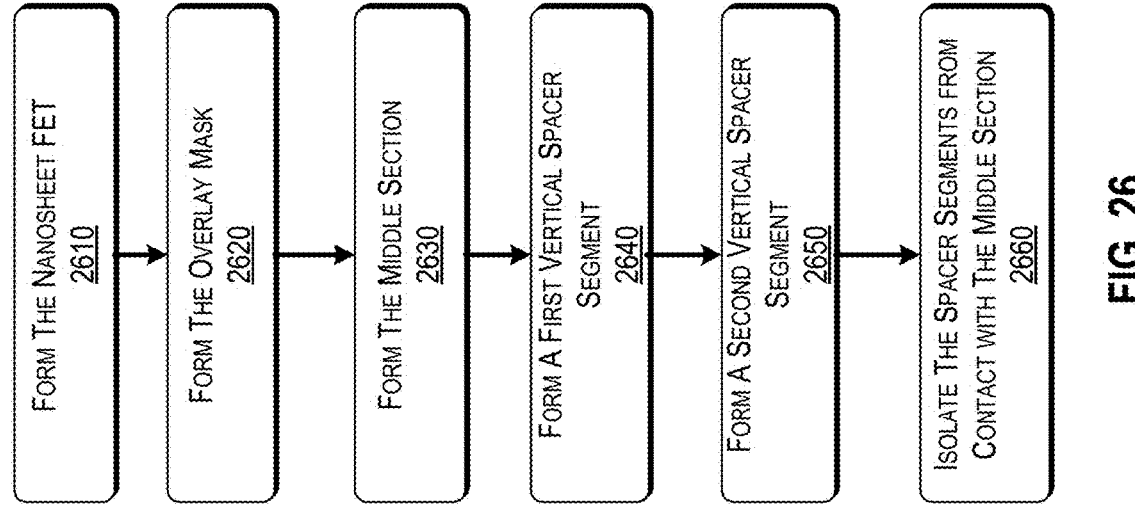
FIG. 26 illustrates a block diagram of a method for forming the semiconductor device, in accordance with some embodiments.

FIG. 26 illustrates a block diagram of a method 2600 for forming the semiconductor device, in accordance with some embodiments. At block 2610, a nanosheet FET is formed.

At block 2620, an overlay mark is formed. The overlay mark can be located adjacent to the nanosheet FET.

At block 2630, forming the overlay mark can include forming a middle section.

At block 2640, forming the overlay mark can include forming a first vertical spacer segment adjacent to the first end of the overlay mark.

At block 2650, forming the overlay mark can include forming a second vertical spacer segment adjacent to the second end of the overlay mark.

At block 2660, forming the overlay mark can include isolating the first spacer segment and the second spacer segment form direct contact with the middle section by a shallow trench isolation (STI).

In one aspect, the method and structures described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

Conclusion

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A semiconductor device comprising:
a nanosheet field effect transistor (FET); and
an overlay mark adjacent to the nanosheet FET, wherein the overlay mark comprises:
a middle section;
a first vertical spacer segment adjacent to a first end of the overlay mark; and
a second vertical spacer segment adjacent to a second end of the overlay mark, wherein the first vertical spacer segment and the second vertical spacer segment are isolated form direct contact with the middle section by a shallow trench isolation (STI).

2. The semiconductor device of claim 1, further comprising:
first alternating layers of a first material and a second material, the first alternating layers extending vertically on the first end of the middle section; and
second alternating layers of the first material and a third material, the second alternating layers extending vertically on the second end of the middle section.

3. The semiconductor device of claim 2, wherein:
the first material includes silicon, the second material includes the first vertical spacer segment, and the third material includes the second vertical spacer segment.

4. The semiconductor device of claim 2, wherein the middle section further comprises:
a substrate horizontally extended from the first end to the second end; and
a source/drain region horizontally extended over the substrate, wherein portions of the source/drain region on the first end and the second end are extended vertically and are in contact with the first alternating layers and the second alternating layers.

5. The semiconductor device of claim 2, wherein:
the first alternating layers are isolated from the first vertical spacer segment via the STI; and
the second alternating layers are isolated from the second vertical spacer segment via the STI.

6. The semiconductor device of claim 4, wherein the source/drain region comprises silicon or silicon germanium.

7. The semiconductor device of claim 1, wherein the nanosheet FET includes nanosheets of silicon layers and silicon germanium layers.

8. A semiconductor device, the semiconductor device comprising:
a nanosheet field effect transistor (FET); and
an overlay mark adjacent to the nanosheet FET, wherein the overlay mark comprises:
a middle section;
a first spacer segment vertically extended over sidewalls of the middle section on a first end; and
a second spacer segment vertically extended over sidewalls of the middle section on a second end.

9. The semiconductor device of claim 8, wherein the middle section further comprises:
a substrate horizontally extended from the first end to the second end; and
a source/drain region horizontally extended over the substrate.

10. The semiconductor device of claim 9, wherein the source/drain region comprises silicon or silicon germanium.

11. The semiconductor device of claim 8, wherein the nanosheet FET includes nanosheets of silicon layers and silicon germanium layers.

12. A method of fabrication of a semiconductor device comprising:

forming a nanosheet field effect transistor (FET); and forming an overlay mark adjacent to the nanosheet FET, wherein forming the overlay mark comprises:

forming a middle section;

forming a first vertical spacer segment adjacent to a first end of the overlay mark; and forming a second vertical spacer segment adjacent to a second end of the overlay mark; and isolating the first vertical spacer segment and the second vertical spacer segment from the middle section by a shallow trench isolation (STI).

13. The method of claim 12, wherein forming the overlay mark further comprises:

forming a substrate extended between the first end and the second end; and forming a source/drain region over the substrate.

14. The method of claim 13, further comprising:

forming the STI over sidewalls of the middle section on the first end and the second end;

removing an isolation layer from a top surface of the substrate; and forming a spacer layer over the top surface of the sub-strate.

15. The method of claim 14, further comprising:

forming first alternating layers of a first material and a second material over the sidewalls of the middle section on the first end; and forming second alternating layers of the first material and a third material over the sidewalls of the middle section on the second end.

16. The method of claim 15, wherein:

the first material includes silicon, the second material includes the first vertical spacer segment, and the third material includes the second vertical spacer segment.

17. The method of claim 13, wherein forming the source/drain region further comprises extending the source/drain region vertically over sidewalls of the first end and sidewalls of the second end.

18. The method of claim 15, further comprising:

isolating the first alternating layers from the first vertical spacer segment via the STI; and isolating the second alternating layers from the second vertical spacer segment via the STI.

19. The method of claim 13, wherein the source/drain region comprises silicon or silicon germanium.

20. The method of claim 12, wherein forming the nanosheet FET further includes forming nanosheets of silicon layers and silicon germanium layers.

* * * * *